United States Patent
Zhu et al.

(10) Patent No.: US 12,236,327 B1
(45) Date of Patent: *Feb. 25, 2025

(54) AUTOMATED SYSTEM AND METHOD FOR MODELING THE BEHAVIOR OF VEHICLES AND OTHER AGENTS

(71) Applicant: WAYMO LLC, Mountain View, CA (US)

(72) Inventors: Jiajun Zhu, Palo Alto, CA (US); David I. Ferguson, San Francisco, CA (US); Dmitri A. Dolgov, Los Altos, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/536,876

(22) Filed: Dec. 12, 2023

Related U.S. Application Data

(63) Continuation of application No. 17/523,350, filed on Nov. 10, 2021, now Pat. No. 11,878,683, which is a
(Continued)

(51) Int. Cl.
*B60W 30/08* (2012.01)
*B60W 30/09* (2012.01)
(Continued)

(52) U.S. Cl.
CPC ............ *G06N 20/00* (2019.01); *B60W 30/08* (2013.01); *B60W 30/09* (2013.01); *B60W 30/095* (2013.01); *B60W 30/0956* (2013.01); *B60W 50/0097* (2013.01); *B60W 60/00133* (2020.02); *B60W 60/00274* (2020.02); *B60W 60/00276* (2020.02); *G05D 1/0088* (2013.01); *G05D 1/0214* (2013.01); *G06N 3/00* (2013.01); *G06V 20/56* (2022.01); *G06V 20/58* (2022.01);
(Continued)

(58) Field of Classification Search
CPC .... B60W 30/09; B60W 30/08; B60W 30/095; B60W 30/0956; B60W 50/0097; B60W 2554/00; G06N 20/00; G06N 3/00; G06V 20/58; G06V 20/584; G06V 20/582; G06V 20/588; G06V 20/56; G06V 10/255; G05D 1/0088; G05D 1/0214; G05D 1/0212; G05D 1/0289; G08G 1/09623; G08G 1/09626; G08G 1/096725; G08G 1/096741; G08G 1/096775; G08G 1/164; G08G 1/165; G08G 1/166; G01R 19/25
See application file for complete search history.

(56) References Cited

U.S. PATENT DOCUMENTS 7,102,496 B1   9/2006  Ernst, Jr. et al.
8,660,734 B2   2/2014  Zhu et al.
(Continued)

*Primary Examiner* — Hussein Elchanti
(74) *Attorney, Agent, or Firm* — Botos Churchill IP Law

(57) ABSTRACT

A method and apparatus are provided for determining one or more behavior models used by an autonomous vehicle to predict the behavior of detected objects. The autonomous vehicle may collect and record object behavior using one or more sensors. The autonomous vehicle may then communicate the recorded object behavior to a server operative to determine the behavior models. The server may determine the behavior models according to a given object classification, actions of interest performed by the object, and the object's perceived surroundings.

20 Claims, 12 Drawing Sheets

Related U.S. Application Data continuation of application No. 16/039,827, filed on Jul. 19, 2018, now Pat. No. 11,198,430, which is a continuation of application No. 15/278,338, filed on Sep. 28, 2016, now Pat. No. 10,059,334, which is a continuation of application No. 13/446,494, filed on Apr. 13, 2012, now Pat. No. 9,495,874.

(51) Int. Cl.

| | | |
|---|---|---|
| *B60W 30/095* | (2012.01) | |
| *B60W 50/00* | (2006.01) | |
| *B60W 60/00* | (2020.01) | |
| *G05D 1/00* | (2006.01) | |
| *G06N 3/00* | (2023.01) | |
| *G06N 20/00* | (2019.01) | |
| *G06V 20/56* | (2022.01) | |
| *G06V 20/58* | (2022.01) | |
| *G08G 1/0962* | (2006.01) | |
| *G08G 1/0967* | (2006.01) | |
| *G08G 1/16* | (2006.01) | |
| *G01R 19/25* | (2006.01) | |
| *G06V 10/20* | (2022.01) | |

(52) U.S. Cl.
CPC .......... *G06V 20/582* (2022.01); *G06V 20/584* (2022.01); *G06V 20/588* (2022.01); *G08G 1/09623* (2013.01); *G08G 1/09626* (2013.01); *G08G 1/096725* (2013.01); *G08G 1/096741* (2013.01); *G08G 1/096775* (2013.01); *G08G 1/164* (2013.01); *G08G 1/165* (2013.01); *G08G 1/166* (2013.01); *B60W 2420/403* (2013.01); *B60W 2420/408* (2024.01); *B60W 2554/00* (2020.02); *B60W 2554/20* (2020.02); *B60W 2554/4023* (2020.02); *B60W 2554/4029* (2020.02); *B60W 2554/80* (2020.02); *B60W 2555/20* (2020.02); *B60W 2556/10* (2020.02); *G01R 19/25* (2013.01); *G05D 1/0212* (2013.01); *G05D 1/0289* (2013.01); *G06V 10/255* (2022.01)

(56) References Cited

U.S. PATENT DOCUMENTS

| | | | |
|---|---|---|---|
| 9,495,874 B1* | 11/2016 | Zhu | B60W 60/00133 |
| 10,059,334 B1* | 8/2018 | Zhu | B60W 50/0097 |
| 10,678,259 B1* | 6/2020 | Ferguson | G06T 7/74 |
| 11,198,430 B1* | 12/2021 | Zhu | G08G 1/09623 |
| 11,878,683 B1* | 1/2024 | Zhu | B60W 60/00133 |
| 2006/0041381 A1 | 2/2006 | Simon et al. | |
| 2006/0106530 A1 | 5/2006 | Horvitz et al. | |
| 2007/0250240 A1* | 10/2007 | Reisner | B60T 7/18 701/70 |
| 2008/0084283 A1 | 4/2008 | Kalik | |
| 2008/0189040 A1 | 8/2008 | Nasu et al. | |
| 2008/0266168 A1 | 10/2008 | Aso et al. | |
| 2008/0303696 A1 | 12/2008 | Aso et al. | |
| 2010/0097200 A1 | 4/2010 | Hilsebecher et al. | |
| 2010/0106418 A1 | 4/2010 | Kindo et al. | |
| 2010/0198477 A1 | 8/2010 | Shirai | |
| 2010/0205132 A1 | 8/2010 | Taguchi et al. | |
| 2010/0305858 A1 | 12/2010 | Richardson | |
| 2011/0054793 A1 | 3/2011 | Harada et al. | |
| 2011/0071731 A1 | 3/2011 | Eidehall et al. | |
| 2011/0087433 A1* | 4/2011 | Yester | G08G 1/096716 701/469 |
| 2011/0313664 A1 | 12/2011 | Sakai et al. | |
| 2011/0313740 A1 | 12/2011 | Ikeda et al. | |
| 2012/0016581 A1* | 1/2012 | Mochizuki | G08G 1/167 701/301 |
| 2012/0059789 A1* | 3/2012 | Sakai | G08G 1/161 706/52 |
| 2012/0083960 A1 | 4/2012 | Zhu et al. | |
| 2012/0179518 A1 | 7/2012 | Jaipaul | |
| 2012/0313806 A1* | 12/2012 | Katoh | G01S 13/931 342/52 |
| 2013/0024075 A1 | 1/2013 | Zagorski | |
| 2013/0151058 A1 | 6/2013 | Zagorski et al. | |
| 2013/0238181 A1 | 9/2013 | James | |
| 2013/0246020 A1 | 9/2013 | Zeng | |
| 2014/0032017 A1 | 1/2014 | Anderson et al. | |
| 2014/0211487 A1* | 7/2014 | Spiro | F21V 29/74 362/382 |
| 2015/0003087 A1* | 1/2015 | Futamura | B60Q 9/008 362/466 |
| 2015/0170498 A1* | 6/2015 | Beggs | B60Q 1/2673 340/686.6 |
| 2016/0137208 A1* | 5/2016 | Powers | G08G 1/096725 701/36 |
| 2019/0333370 A1* | 10/2019 | Malkes | G06V 40/103 |

* cited by examiner

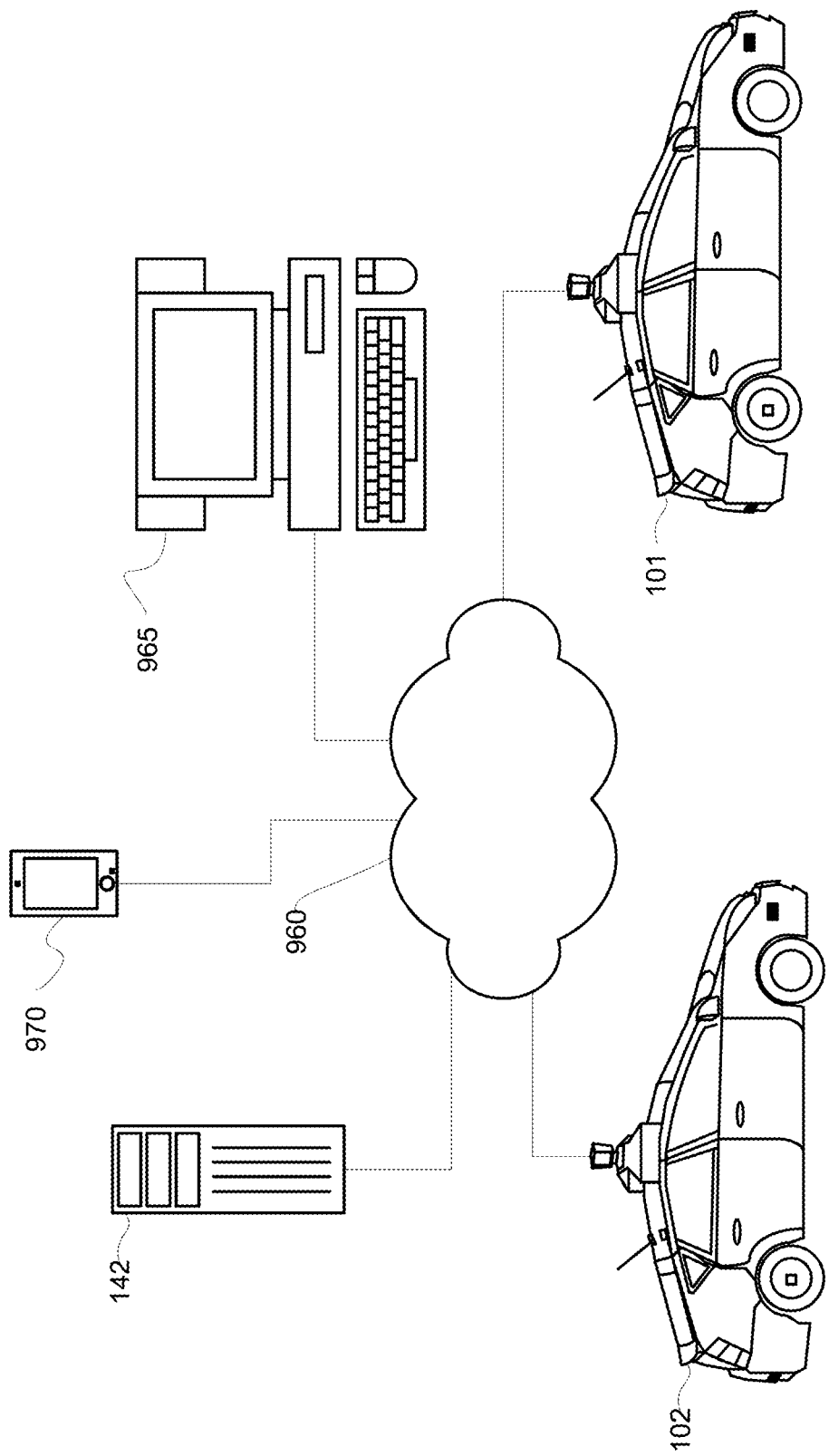

AUTOMATED SYSTEM AND METHOD FOR MODELING THE BEHAVIOR OF VEHICLES AND OTHER AGENTS

CROSS-REFERENCE TO RELATED APPLICATIONS

The present application is a continuation of U.S. patent application Ser. No. 17/523,350, filed Nov. 10, 2021, which is a continuation of U.S. patent application Ser. No. 16/039,827, filed Jul. 19, 2018, now U.S. Pat. No. 11,198,430, which is a continuation of U.S. patent application Ser. No. 15/278,338, filed Sep. 28, 2016, now U.S. Pat. No. 10,059,334, which is a continuation of U.S. patent application Ser. No. 13/446,494, filed Apr. 13, 2012, now U.S. Pat. No. 9,495,874, the disclosures of which are incorporated herein by reference.

BACKGROUND

Autonomous vehicles use various computing systems to aid in the transport passengers from one location to another. Some autonomous vehicles may require some initial input or continuous input from an operator, such as a pilot, driver, or passenger. Other systems, for example autopilot systems, may be used only when the system has been engaged, which permits the operator to switch from a manual mode (where the operator exercises a high degree of control over the movement of the vehicle) to an autonomous mode (where the vehicle essentially drives itself) to modes that lie somewhere in between.

BRIEF SUMMARY

An apparatus for managing behavior models used by an autonomous vehicle to predict the behavior of a corresponding object is disclosed. In one aspect, a server determines behavior models to be used by an autonomous vehicle to predict the behavior of a detected object. The server may include a memory configured to store first object data and behavior model data for a first object, and the server may include a processor in communication with the memory. The processor being configured to receive second object data from a monitoring source, wherein the second object data comprises world-view data and actions-of-interest data for a detected object. The processor also being configured to analyze the second object data to determine the detected object's classification and to determine whether a behavior model exists for the detected object based on the detected object's classification. The processor further configured to create the behavior model for the detected object based on the world-view data and actions-of-interest data, when a behavior model does not exist for the detected object's classification. Alternatively, the server may update the behavior model for the detected object based on the world-view data and actions-of-interest data, when the behavior model exists for the detected object's classification.

In another aspect, the second object data indicates that the detected object is in proximity to one or more nearby objects, and the world-view data comprises position and movement data of one or more of the nearby objects from a perspective of the detected object.

In yet another aspect, the actions-of-interest data indicates that the detected object has been positioned or has moved in a predefined manner relative to one or more road graph elements. The road graph elements may comprise a first lane of traffic and a second lane of traffic, and the actions-of-interest data may indicate that the detected object has changed from the first lane of traffic to the second lane of traffic.

In still another aspect, the monitoring source is an autonomous vehicle, and the detected object is one of an automobile, a pedestrian, or a bicycle.

In another aspect, the behavior model may comprise a plurality of probabilities, and at least one probability is based on a path of travel that the first object was observed traveling. At least one probability of the plurality of probabilities may identify a probability that a second object will travel an associated path of travel previously traveled by the first object. In addition, the behavior model may comprise a plurality of probabilities, wherein at least one probability is based on first world-view data for the first object, and wherein at least one probability is based on first actions-of-interest data for the first object.

In still another aspect, the server is further configured to determine a plurality of behavior models for the detected object's classification, and wherein each behavior model corresponds to a different set of world-view data or actions-of-interest data. The server is may also be configured to communicate the behavior model to an autonomous vehicle, which may alter its control strategy in response to the communicated behavior model.

BRIEF DESCRIPTION OF THE FIGURES

FIG. 10 a functional diagram of a communication system in accordance with an aspect of the disclosure.

DETAILED DESCRIPTION

Aspects of the disclosure relate generally to a system and method of modeling behavior of objects detected by an autonomous vehicle. In particular, a vehicle implementing the autonomous driving system is capable of detecting and reacting to surrounding objects. Some of the detected objects will be mobile, such as pedestrians, automobiles, and bicycles. As set forth below, the autonomous driving system is able to identify surrounding objects and determine how those objects perceive their surroundings. The system is also able to identify when specific actions of interest have been performed by the detected object. The autonomous vehicle records the data relating to the detected object's perceived surroundings, as well as any identified action of interest, and then communicates the recorded data to a server for behavior modeling. The server may then provide the autonomous vehicle with updated modeling data, allowing the autonomous vehicle to predict the object's likely movements. In turn, the vehicle may react to nearby objects in a way that decreases the likelihood of an accident and increases the efficiency of travel.

Figure 1:
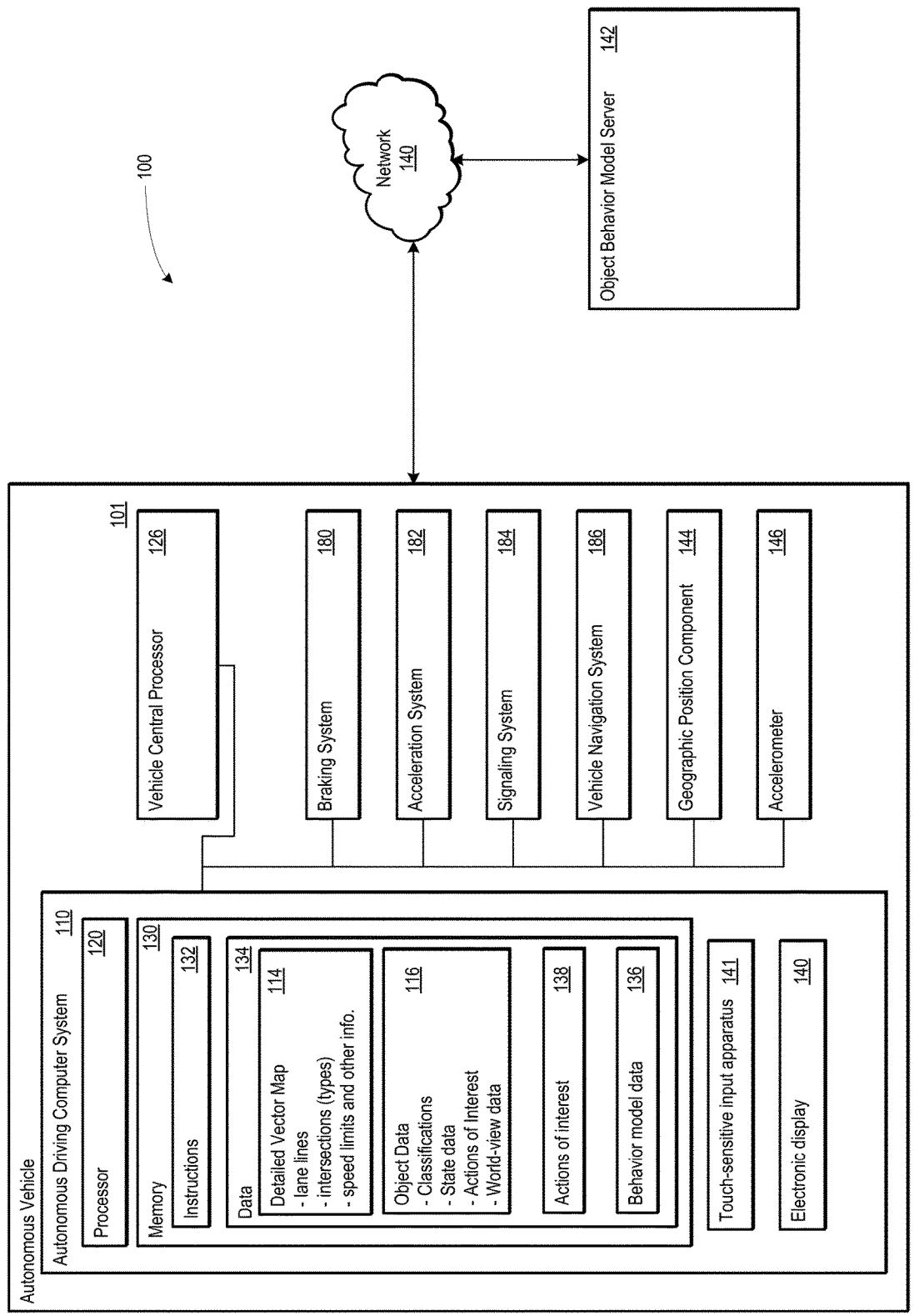
FIG. 1 is a functional diagram of an autonomous navigation system in accordance with an aspect of the disclosure.

As shown in FIG. 1, an autonomous driving system 100 in accordance with one aspect of the disclosure is included within a vehicle 101 with various components. While certain aspects of the disclosure are particularly useful in connection with specific types of vehicles, the vehicle may be any type of vehicle including, but not limited to, cars, trucks, motorcycles, busses, boats, airplanes, helicopters, lawnmowers, recreational vehicles, amusement park vehicles, trams, golf carts, trains, and trolleys. The vehicle may have one or more computers, such as computer 110 containing a processor 120, memory 130 and other components typically present in general purpose computers.

The memory 130 stores information accessible by processor 120, including instructions 132 and data 134 that may be executed or otherwise used by the processor 120. The memory 130 may be of any type capable of storing information accessible by the processor, including a computer-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 132 may be any set of instructions to be executed directly (such as machine code) or indirectly (such as scripts) by the processor. For example, the instructions may be stored as computer code on the computer-readable medium. In that regard, the terms "instructions" and "programs" may be used interchangeably herein. The instructions may be stored in object code format for direct processing by the processor, or in any other computer language including scripts or collections of independent source code modules that are interpreted on demand or compiled in advance. Functions, methods and routines of the instructions are explained in more detail below.

The data 134 may be retrieved, stored or modified by processor 120 in accordance with the instructions 132. For instance, although the system and method is not limited by any particular data structure, the data may be stored in computer registers, in a relational database as a table having a plurality of different fields and records, XML documents or flat files. The data may also be formatted in any computer-readable format. By further way of example only, image data may be stored as bitmaps comprised of grids of pixels that are stored in accordance with formats that are compressed or uncompressed, lossless (e.g., BMP) or lossy (e.g., JPEG), and bitmap or vector-based (e.g., SVG), as well as computer instructions for drawing graphics. The data may comprise any information sufficient to identify the relevant information, such as numbers, descriptive text, proprietary codes, references to data stored in other areas of the same memory or different memories (including other network locations) or information that is used by a function to calculate the relevant data.

The processor 120 may be any conventional processor, including commercially available processors. Alternatively, the processor may be a dedicated device such as an ASIC or FPGA. Although FIG. 1 functionally illustrates the processor, memory, and other elements of computer 110 as being within the same block, it will be understood by those of ordinary skill in the art that the processor and memory may actually comprise multiple processors and memories that may or may not be stored within the same physical housing. For example, memory may be a hard drive or other storage media located in a housing different from that of computer 110. Accordingly, references to a processor or computer will be understood to include references to a collection of processors or computers or memories that may or may not operate in parallel. Rather than using a single processor to perform the steps described herein some of the components such as steering components and deceleration components may each have their own processor that only performs calculations related to the component's specific function.

In various of the aspects described herein, the processor may be located remote from the vehicle and communicate with the vehicle wirelessly. In other aspects, some of the processes described herein are executed on a processor disposed within the vehicle and others by a remote processor, including taking the steps necessary to execute a single maneuver.

Computer 110 may include all of the components normally used in connection with a computer, such as a central processing unit (CPU), memory (e.g., RAM and internal hard drives) storing data 134 and instructions such as a web browser, an electronic display 140 (e.g., a monitor having a screen, a small LCD touch-screen 141 or any other electrical device that is operable to display information), user input (e.g., a mouse, keyboard, touch screen and/or microphone), as well as various sensors (e.g. a video camera) for gathering the explicit (e.g. a gesture) or implicit (e.g. "the person is asleep") information about the states and desires of a person.

The vehicle may also include a geographic position component 144 in communication with computer 110 for determining the geographic location of the device. For example, the position component may include a GPS receiver to determine the device's latitude, longitude and/or altitude position. Other location systems such as laser-based localization systems, inertial-aided GPS, or camera-based localization may also be used to identify the location of the vehicle. The location of the vehicle may include an absolute geographical location, such as latitude, longitude, and altitude as well as relative location information, such as location relative to other cars immediately around it which can often be determined with less noise than absolute geographical location.

The device may also include other features in communication with computer 110, such as an accelerometer, gyroscope or another direction/speed detection device 146 to determine the direction and speed of the vehicle or changes thereto. By way of example only, acceleration device 146 may determine its pitch, yaw or roll (or changes thereto) relative to the direction of gravity or a plane perpendicular thereto. The device may also track increases or decreases in speed and the direction of such changes. The device's provision of location and orientation data as set forth herein may be provided automatically to the user, computer 110, other computers and combinations of the foregoing.

The computer 110 may control the direction and speed of the vehicle by controlling various components. By way of example, if the vehicle is operating in a completely autonomous mode, computer 110 may cause the vehicle to accelerate (e.g., by increasing fuel or other energy provided to the engine), decelerate (e.g., by decreasing the fuel supplied to the engine or by applying brakes) and change direction (e.g., by turning the front two wheels).

Figure 2:
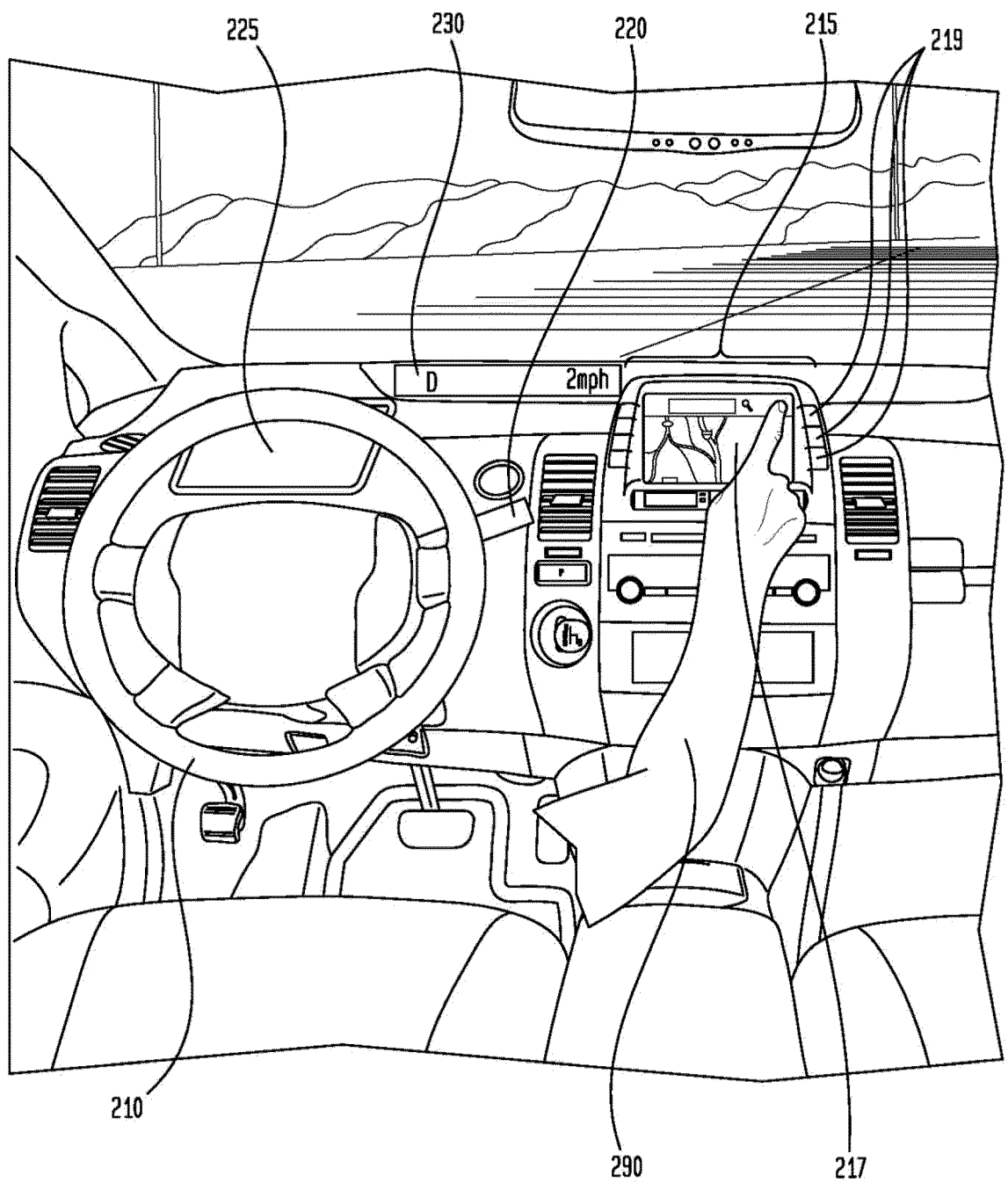
FIG. 2 is an exemplary design of the interior of an autonomous vehicle in accordance with an aspect of the disclosure.

Computer 110 may also control status indicators, in order to convey the status of the vehicle and its components to a passenger of vehicle 101. For example, as shown in FIG. 2, vehicle 101 may be equipped with a display 225 for displaying information relating to the overall status of the vehicle, particular sensors, or computer 110 in particular. The display 225 may include computer generated images of the vehicle's surroundings including, for example, the status of the computer (cruise), the vehicle itself, roadways, intersections, as well as other objects and information.

Computer 110 may use visual or audible cues to indicate whether computer 110 is obtaining valid data from the various sensors, whether the computer is partially or completely controlling the direction or speed of the car or both, whether there are any errors, etc. Vehicle 101 may also include a status indicating apparatus, such as status bar 230, to indicate the current status of vehicle 101. Status bar 230 displays "D" and "2 mph" indicating that the vehicle is presently in drive mode and is moving at 2 miles per hour. In that regard, the vehicle may display text on an electronic display, illuminate portions of vehicle 101, or provide various other types of indications. In addition, the computer may also have external indicators which indicate whether, at the moment, a human or an automated system is in control of the vehicle, that are readable by humans, other computers, or both.

Returning to FIG. 1, computer 110 may be an autonomous driving computing system capable of communicating with various components of the vehicle. For example, computer 110 may be in communication with the vehicle's conventional central processor 126 and may send and receive information from the various systems of vehicle 101, for example the braking 180, acceleration 182, signaling 184, and navigation 186 systems in order to control the movement, speed, etc. of vehicle 101. In addition, when engaged, computer 110 may control some or all of these functions of vehicle 101 and thus be fully or partially autonomous. It will be understood that although various systems and computer 110 are shown within vehicle 101, these elements may be external to vehicle 101 or physically separated by large distances.

As shown in FIG. 2, the interior of the autonomous vehicle may include all of the features of a non-autonomous vehicle, for example: a steering apparatus, such as steering wheel 210; a navigation display apparatus, such as navigation display 215; and a gear selector apparatus, such as gear shifter 220.

The vehicle may include components for detecting objects external to the vehicle such as other vehicles, obstacles in the roadway, traffic signals, signs, trees, etc. The detection system may include lasers, sonar, radar, cameras or any other detection devices. For example, if the vehicle is a small passenger car, the car may include a laser mounted on the roof or other convenient location. In one aspect, the laser may measure the distance between the vehicle and the object surfaces facing the vehicle by spinning on its axis and changing its pitch. The vehicle may also include various radar detection units, such as those used for adaptive cruise control systems. The radar detection units may be located on the front and back of the car as well as on either side of the front bumper. In another example, a variety of cameras may be mounted on the car at distances from one another which are known so that the parallax from the different images may be used to compute the distance to various objects which are captured by 2 or more cameras. These sensors allow the vehicle to understand and potentially respond to its environment in order to maximize safety for passengers as well as objects or people in the environment.

Many of these sensors provide data that is processed by the computer in real-time, that is, the sensors may continuously update their output to reflect the environment being sensed at or over a range of time, and continuously or as-demanded provide that updated output to the computer so that the computer can determine whether the vehicle's then-current direction or speed should be modified in response to the sensed environment.

Figure 3:
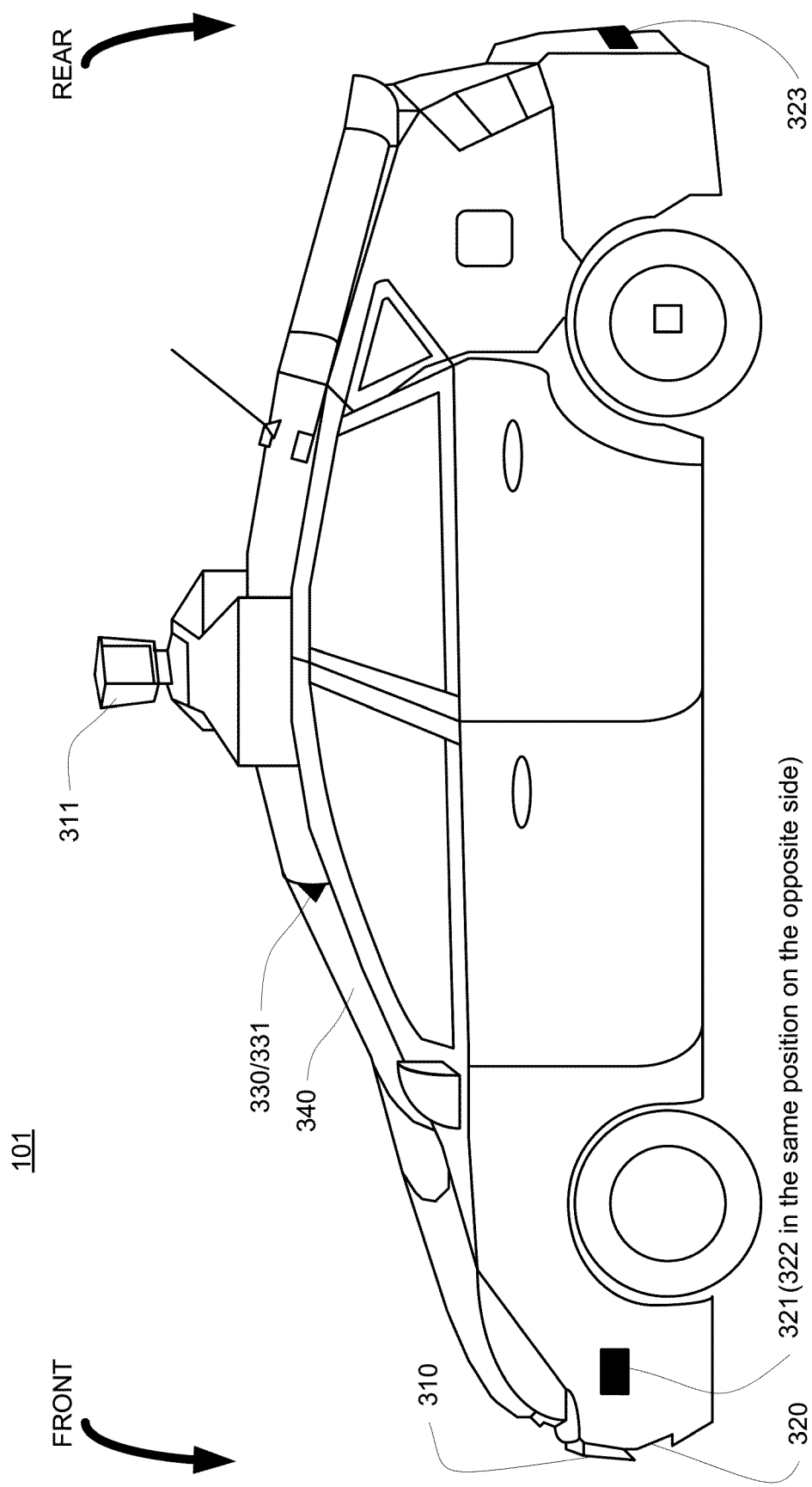
FIG. 3 is a view of the exterior of an exemplary vehicle in accordance with an aspect of the disclosure.

FIG. 3 illustrates a particular embodiment for a small passenger vehicle 101 that includes lasers 310 and 311, mounted on the front and top of the vehicle, respectively. Laser 310 may have a range of approximately 150 meters, a thirty degree vertical field of view, and approximately a thirty degree horizontal field of view. Laser 311 may have a range of approximately 50-80 meters, a thirty degree vertical field of view, and a 360 degree horizontal field of view. The lasers may provide the vehicle with range and intensity information which the computer may use to identify the location and distance of various objects. In one aspect, the lasers may measure the distance between the vehicle and the object surfaces facing the vehicle by spinning on its axis and changing its pitch.

The vehicle may also include various radar detection units, such as those used for adaptive cruise control systems. The radar detection units may be located on the front and back of the car as well as on either side of the front bumper. As shown in the example of FIG. 3, vehicle 101 includes radar detection units 320-323 located on the side (only one side being shown), front and rear of the vehicle. Each of these radar detection units may have a range of approximately 200 meters for an approximately 18 degree field of view as well as a range of approximately 60 meters for an approximately 56 degree field of view.

In another example, a variety of cameras may be mounted on the vehicle. The cameras may be mounted at predetermined distances so that the parallax from the images of 2 or more cameras may be used to compute the distance to various objects. As shown in FIG. 3, vehicle 101 may include 2 cameras 330-331 mounted under a windshield 340 near the rear view mirror (not shown). Camera 330 may include a range of approximately 200 meters and an approximately 30 degree horizontal field of view, while camera 331 may include a range of approximately 100 meters and an approximately 60 degree horizontal field of view.

Figure 4A:
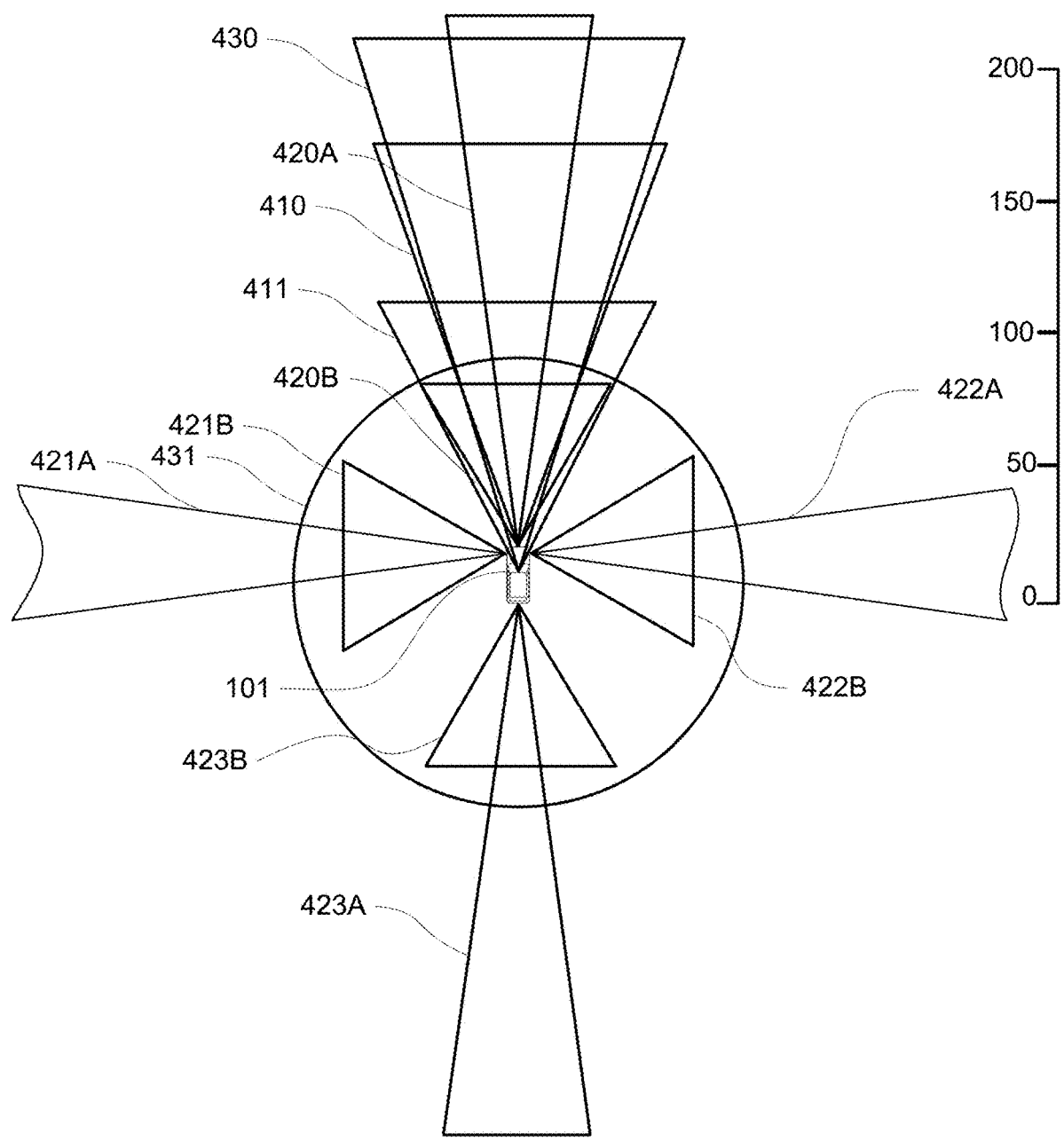
FIGS. 4A-4D are views of the sensor fields for an autonomous vehicle.

Each sensor may be associated with a particular sensor field in which the sensor may be used to detect objects. FIG. 4A is a top-down view of the approximate sensor fields of the various sensors. FIG. 4B depicts the approximate sensor fields 410 and 411 for lasers 310 and 311, respectively based on the fields of view for these sensors. For example, sensor field 410 includes an approximately 30 degree horizontal field of view for approximately 150 meters, and sensor field 411 includes a 360 degree horizontal field of view for approximately 80 meters.

Figure 4C:
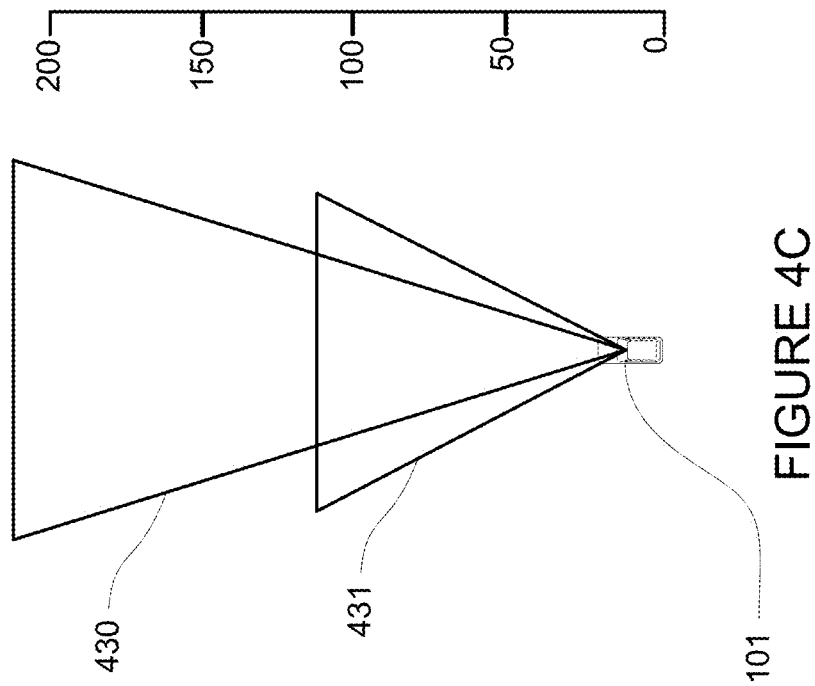
Figure 4B:
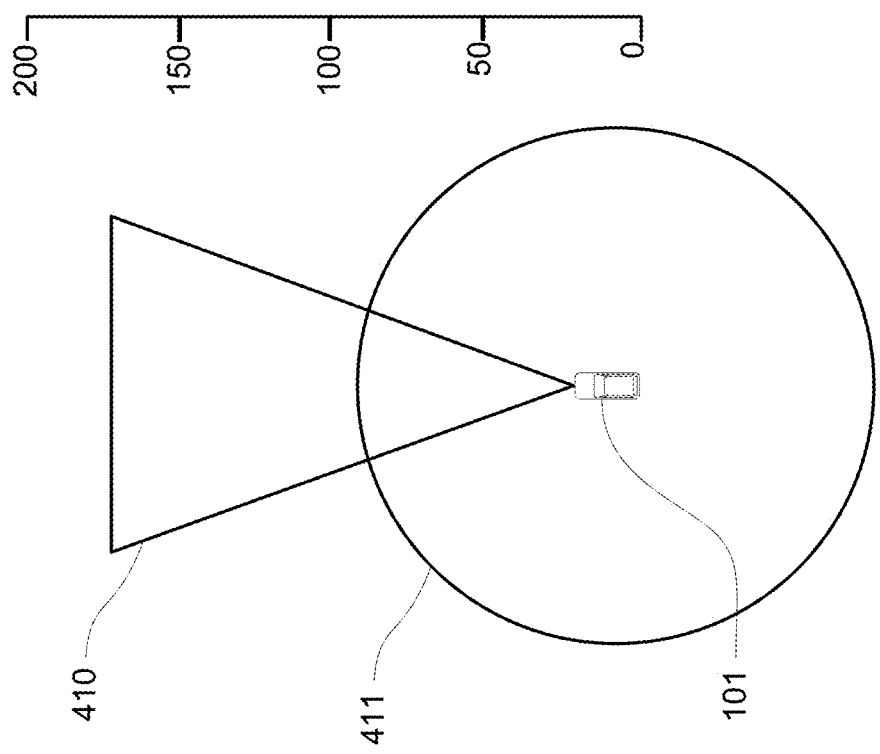
Figure 4D:
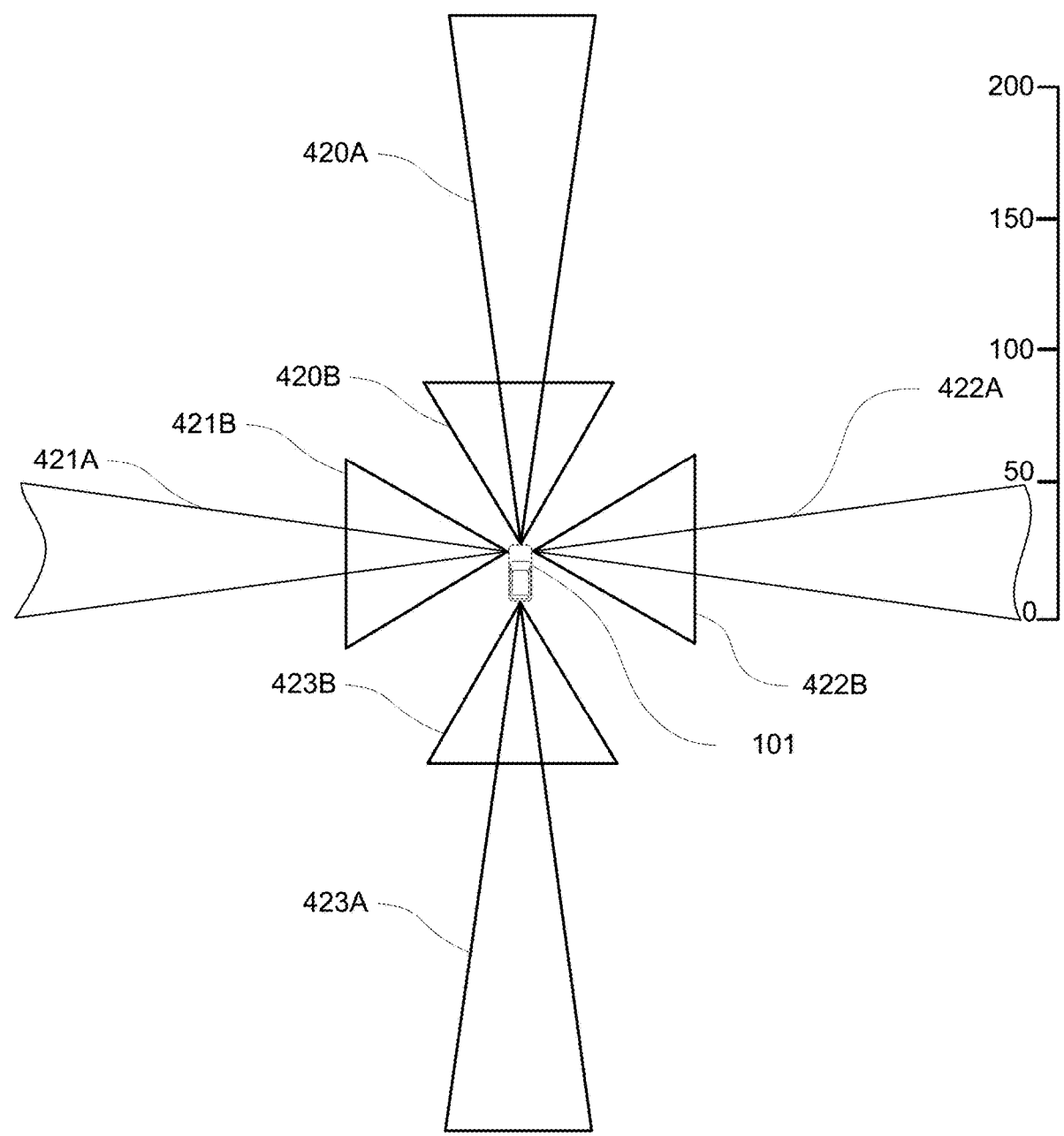

FIG. 4D depicts the approximate sensor fields 420A-423B and for radar detection units 320-323, respectively, based on the fields of view for these sensors. For example, radar detection unit 320 includes sensor fields 420A and 420B. Sensor field 420A includes an approximately 18 degree horizontal field of view for approximately 200 meters, and sensor field 420B includes an approximately 56 degree horizontal field of view for approximately 80 meters. Similarly, radar detection units 321-323 include sensor fields 421A-423A and 421B-423B. Sensor fields 421A-423A include an approximately 18 degree horizontal field of view for approximately 200 meters, and sensor fields 421B-423B include an approximately 56 degree horizontal field of view for approximately 80 meters. Sensor fields 421A and 422A extend passed the edge of FIGS. 4A and 4D.

FIG. 4C depicts the approximate sensor fields 430-431 cameras 330-331, respectively, based on the fields of view for these sensors. For example, sensor field 430 of camera 330 includes a field of view of approximately 30 degrees for approximately 200 meters, and sensor field 431 of camera 430 includes a field of view of approximately 60 degrees for approximately 100 meters.

In another example, an autonomous vehicle may include sonar devices, stereo cameras, a localization camera, a laser, and a radar detection unit each with different fields of view. The sonar may have a horizontal field of view of approximately 60 degrees for a maximum distance of approximately 6 meters. The stereo cameras may have an overlapping region with a horizontal field of view of approximately 50 degrees, a vertical field of view of approximately 10 degrees, and a maximum distance of approximately 30 meters. The localization camera may have a horizontal field of view of approximately 75 degrees, a vertical field of view of approximately 90 degrees and a maximum distance of approximately 10 meters. The laser may have a horizontal field of view of approximately 360 degrees, a vertical field of view of approximately 30 degrees, and a maximum distance of 100 meters. The radar may have a horizontal field of view of 60 degrees for the near beam, 30 degrees for the far beam, and a maximum distance of 200 meters.

As described below, autonomous vehicle's computer system is able to track a detected object's movements and record data associated with the object and its movements. Once a nearby object is detected, system 100 may determine the object's type, for example, a traffic cone, person, car, truck or bicycle. Objects may be identified by using object classification data 116 (shown in FIG. 1), which may consider various characteristics of the detected objects, such as the size of an object, the speed of the object (bicycles do not tend to go faster than 40 miles per hour or slower than 0.1 miles per hour), the heat coming from the bicycle (bicycles tend to have rider that emit heat from their bodies), etc. In addition, the object may be classified based on specific attributes of the object, such as information contained on a license plate, bumper sticker, or logos that appear on the vehicle.

In one example, autonomous driving system 100 is operable to predict another vehicle's future movement based solely on the other vehicle's instant direction, acceleration/deceleration and velocity, e.g., that the other vehicle's current direction and movement will continue. However, autonomous vehicle may access a behavior model that provides the probability of one or more actions being taken by the detected object. Specifically, system 100 may predict a detected vehicle's future movement by analyzing data relating to the other vehicle's current surroundings and determining how the other vehicle will likely respond to those surroundings. In other words, autonomous driving system 100 uses an object-centric, view of the object's environment, in that the system determines what the other vehicles are perceiving in order to better predict how those vehicles will behave.

The system may also collect information that is independent of other detected object's in order to predict the an object's next action. By way of example, if the vehicle determines that another object is a bicycle that is beginning to ascend a steep hill in front of the vehicle, the computer may predict that the bicycle will soon slow down—and will slow the vehicle down accordingly—regardless of whether the bicycle is currently traveling at a somewhat high speed.

The computer may cause the vehicle to take particular actions in response to the predicted actions of the surrounding objects. For example, if the computer 110 determines that the other car is turning at the next intersection as noted above, the computer may slow the vehicle down as it approaches the intersection. In this regard, the predicted behavior of other objects is based not only on the type of object and its current trajectory, but also based on some likelihood that the object may obey traffic rules or predetermined behaviors. In another example, the system may include a library of rules about what objects will do in various situations. For example, a car in a left-most lane that has a left-turn arrow mounted on the light will very likely turn left when the arrow turns green. The library may be built manually, or by the vehicle's observation of other vehicles (autonomous or not) on the roadway. The library may begin as a human built set of rules which may be improved by the vehicle's observations. Similarly, the library may begin as rules learned from vehicle observation and have humans examine the rules and improve them manually. This observation and learning may be accomplished by, for example, tools and techniques of machine learning. The rules library may be included in computer 110 or may alternatively be accessible to the vehicle 101 via a remote server, such as server 142 of FIG. 7.

In addition to processing data provided by the various sensors, the computer may rely on environmental data that was obtained at a previous point in time and is expected to persist regardless of the vehicle's presence in the environment. As shown in FIG. 1, data 134 may include detailed map information 114, such as highly detailed maps identifying the shape and elevation of roadways, lane lines, intersections, crosswalks, speed limits, traffic signals, buildings, signs, real time traffic information, or other such objects and information. For example, the map information may include explicit speed limit information associated with various roadway segments. The speed limit data may be entered manually or scanned from previously taken images of a speed limit sign using, for example, optical-character recognition. The map information may include three-dimensional terrain maps incorporating one or more of objects listed above. For example, the vehicle may determine that another car is expected to turn based on real-time data (e.g., using its sensors to determine the current GPS position of another car) and other data (e.g., comparing the GPS position with previously-stored lane-specific map data to determine whether the other car is within a turn lane).

The computer 110 may also access data 134 relating to certain types of objects that the vehicle 101 may encounter. As described above, the sensors of vehicle 101 may be used to identify, track and predict the movements of pedestrians, bicycles, vehicles, or other objects in or around the roadway. These objects may have particular behavior patterns that depend on the nature of the object. For example, a bicycle is likely to react differently than a tractor-trailer in a number of ways. Specifically, a bicycle is more likely to make erratic movements when compared with a tractor-trailer. Accordingly, in predicting an objects behavior, computer 110 may access behavior model data 136 and object data 116 that contains numerous object classifications, such as pedestrians, bicycles, cars, tractor-trailers, etc. For each classification, the behavior model data 136 may also contain behavior information that indicates how an object having a particular classification is likely to behave in a given situation. Vehicle 101 may then autonomously respond to the object based, in part, on the predicted behavior.

In addition to classifying the object, vehicle 101 may track a current state of the object. The object's state may include information used to determine the object's classification, but any type of environmental or contextual information may be used to determine the object's current state, such as the object's speed, route the object has traveled, nature of the roadway on which the object is traveling, or the object's use of headlights or blinkers.

Figure 5:
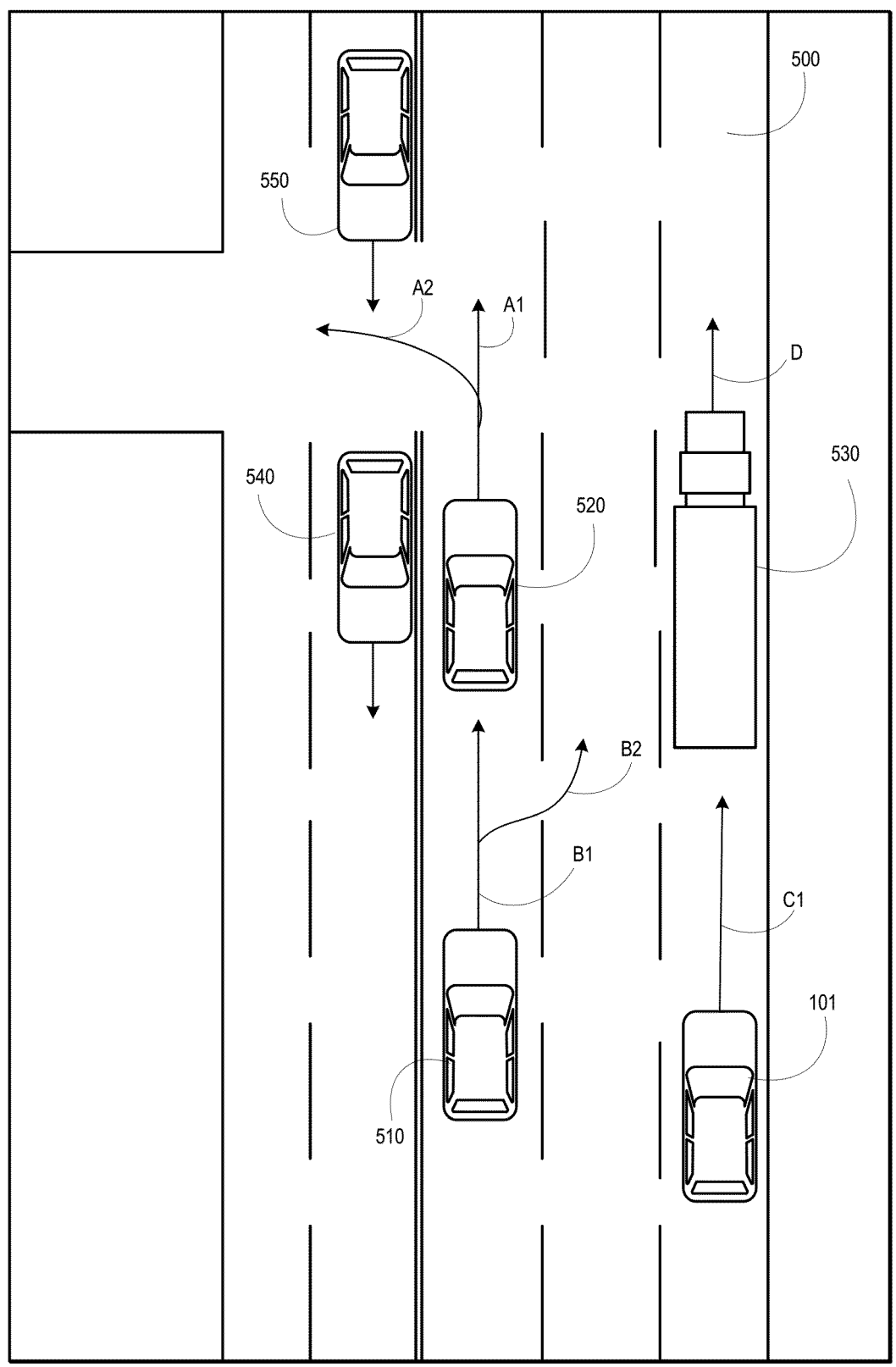
FIG. 5 is a view of an autonomous vehicle traveling autonomously in proximity to other vehicles.

FIG. 5 illustrates an example of vehicle 101 detecting surrounding objects. Using the sensors described above, autonomous vehicle 101 is capable of detecting surrounding vehicles 510-550. As indicated by directional arrows A1, B1, C, and D, vehicle 510 and vehicle 520 are currently traveling along the center lane, while autonomous vehicle 101 and vehicle 530 are traveling north in the right-hand lane. Upon detecting the surrounding vehicles, computer system 110 may track and record the position and movement (e.g. velocity, heading, and acceleration) of each surrounding vehicle.

The position and movement data for the detected vehicles 510-550 may be stored in database 116 of the autonomous driving computer system, as shown in FIG. 1. The autonomous vehicle may then use this data to maneuver vehicle 101 in a way that avoids collisions with nearby vehicles. In accordance with one embodiment, computer system 110 may filter the position and movement data, so as to identify a vehicle's position and movement during particular actions of interest.

For example, database 138 may include a set of actions or behaviors of interest, such as the vehicle changing lanes or routes, and instructions 132 may allow for computer system 110 to identify when a detected vehicle has performed one or more of the behaviors of interest. In particular, computer system 110 of FIG. 1 may access the recorded position and movement stored in database 116, as well as a road graph of the environment stored in database 114. By combining both sets of data, computer system 110, may then determine when one or more of the key behaviors have occurred.

Returning to FIG. 5, vehicle 101 may record the position and movement data of vehicle 510 and vehicle 520. In doing so, vehicle 101 can detect that vehicle 520 has de-accelerated and is changing its heading in the direction of arrow A2. Similarly, vehicle 101 detects that vehicle 510 has changed its heading as provided by arrow B2. Vehicle 101 may then access stored road graph data that represents vehicle the current environment of vehicles 510 and 520, such as road graph 600 illustrated in FIG. 6. Based on the position and movement of vehicles 510 and 520, relative to vehicle 101, the computer system of vehicle 101 may associate vehicles 510 and 520 with the center lane of City Highway. The computer system of vehicle 101 may then compare the changed heading of vehicle 520 with the stored road graph to determine that vehicle 520 is turning from City Highway to Through Street, at point 610. Likewise, the computer system compares the change in heading of vehicle 510 with map 600 to determine that the vehicle has changed from the center lane to the adjacent lane to the right, at point 620.

Figure 6:
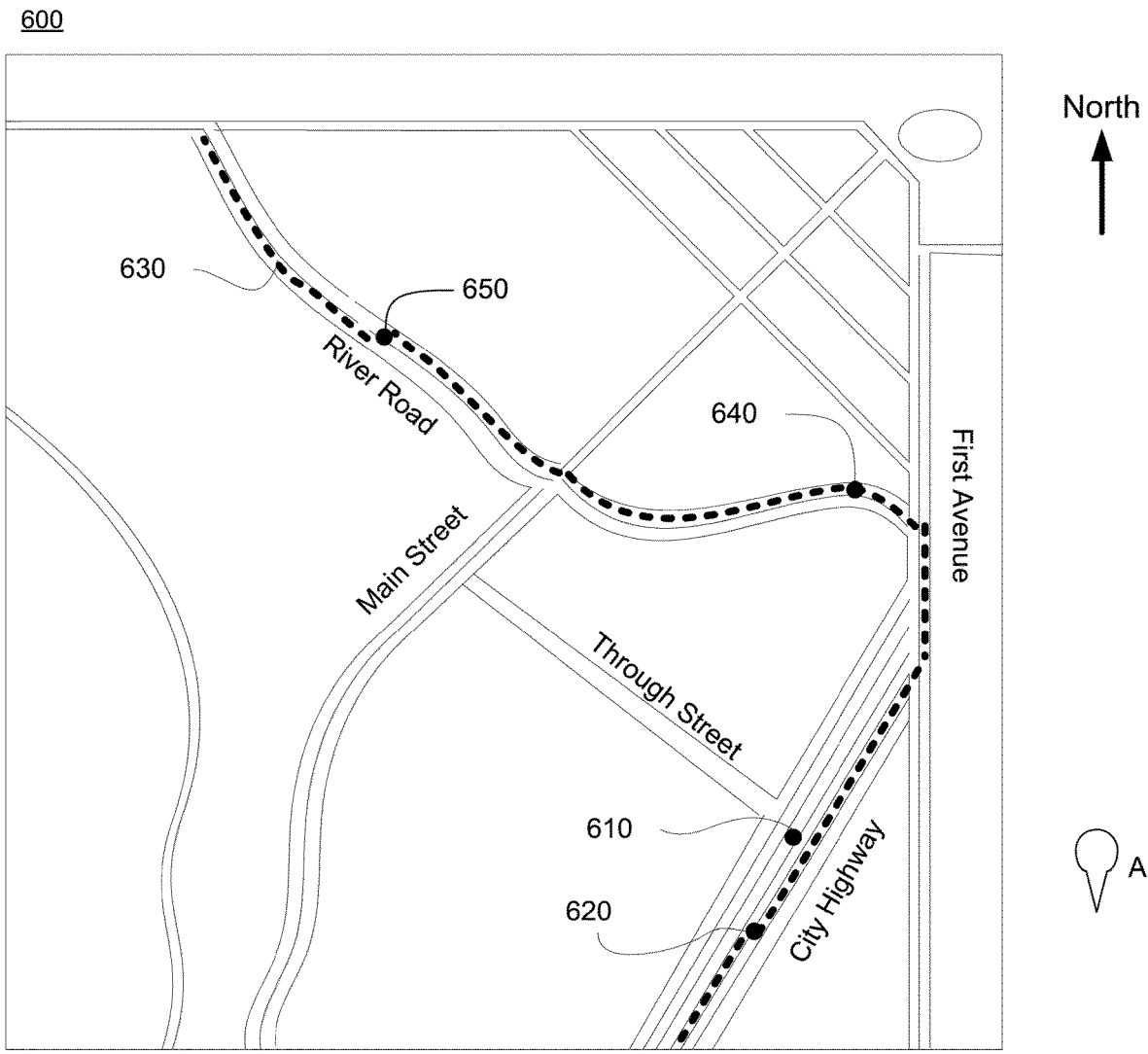
FIG. 6 is map in accordance with an aspect of the disclosure.

In this way, vehicle 101 may associate and track all surrounding vehicles with a particular road graph element, such as a lane of travel or intersection. For example, dashed line 630 in FIG. 6 represents the path of travel of vehicle 510. Provided that vehicle 510 remains within an area that can be detected by vehicle 101, this path may be recorded by vehicle 101's computer system. By combining the vehicle's movement data with map 600, vehicle 101 identifies instances along vehicle 510's path where it has performed one or more behaviors of interest. For example, the computer system of vehicle 101 may identify any change in road element as a behavior of interest, such as vehicle 510 traveling from City Highway, to First Avenue, and then to River Road. In addition, vehicle 101 may identify when vehicle 510 has changed lanes on a particular roadway, such as at points 620 and 650.

Vehicle 101 may also filter the data collected for vehicle 510 so that it only contains instances where vehicle 510 has performed an action of interest. As provided by line 630 on map 600, vehicle 510 changes it's heading around point 640, as it begins to travel from a north-west direction to a more south-west direction. While vehicle 101 will collect data regarding vehicle 510's change in heading, computer 110 will also determine that the change in heading does not correspond to an action of interest, as vehicle 510 merely travels along the same road graph element. Vehicle 101 may, in turn, exclude the data corresponding to vehicle 510's change in heading at point 640 as being recorded as an action of interest.

In another embodiment, autonomous vehicle 101 may transport itself, passengers, and/or cargo between two locations by following a route. For example, a driver may input a destination and activate an autonomous mode of the vehicle. In response, the vehicle's computer 110 may calculate a route using a map, its current location, and the destination. Based on the route (or as part of the route generation), the vehicle may determine a control strategy for controlling the vehicle along the route to the destination. In accordance with one embodiment, computer system 110 may control the autonomous vehicle 101 to take particular actions in response to the actions of the surrounding objects that have been identified as performing a behavior of interest. For example, by changing lanes as provided by arrow B2 of FIG. 5, vehicle 101 may identify that vehicle 510 has performed a behavior of interest and thereby reevaluate the current control strategy of vehicle 101. Specifically, computer system 110 may determine that vehicle 101 should decelerate in order to avoid travelling in vehicle 510's blind-spot, given that vehicle 510 is now travelling in the adjacent lane.

As another example, vehicle 520 may come to a stop for a period of time before making the left-hand turn designated by arrow A2. Computer system 110 may identify this action as a behavior of interest, depending on which road element vehicle 520 is travelling. Specifically, if vehicle 520 is determined to be in a left-hand turn lane, vehicle 101 may not identify vehicle 520 having stopped will not as a behavior of interest. However, if vehicle 520 was travelling one lane over to the right, the fact that it has stopped could indicate that there is a backup ahead. Accordingly, vehicle 101 may record instances where the detected objects have performed actions of interest.

In addition to determining instance when a detected object has performed an action of interest, autonomous vehicle 101 may also record how each nearby vehicle perceives its surroundings. In the case of vehicle 510, nearby objects include vehicles 510, 520, 530, 540, and 550, as well as autonomous vehicle 101. Accordingly, autonomous vehicle 101 uses the sensors described above to collect position and movement data for each of these nearby objects relative to vehicle 510. The relative position and movement data is object-centric, in that it represents the detected object's "world-view", based on how the object views its surroundings. This world-view data may be stored in database 116, shown in FIG. 1.

The autonomous driving computer system 100 may also collect object data to create or further refine already existing behavior models used to predict the likely movements of detected objects, such as vehicles or pedestrians. For example, the collected object data may supplement information already used to initially construct the behavior model. In other words, the supplemental object data may provide additional statistical information about the behavior of a detected object to further refine the probable behaviors of the object in the given environment. Thus, as the autonomous vehicle 101 moves about its environment, the supplemental state information may improve the reliability and predictability of a given behavior model.

The autonomous vehicle 101 may collect state information about detected objects regardless of whether the autonomous vehicle 101 is operating in an autonomous mode or a non-autonomous mode. Thus, whether the autonomous vehicle 101 is operating by itself or has a driver, the autonomous vehicle 101 may collect state and object information to formulate the aforementioned behavior models.

It should also be understood that object data may be collected by other means other than the autonomous vehicle 101. For example, object data may be collected by a non-autonomous vehicle, satellite imagery, traffic reports, police reports, user-provided information, or other such means. In addition, these other data collection means by work in concert with the autonomous vehicle 101 and may communicate the collected object data to the autonomous vehicle 101. For example, one or more sensors placed in a driving environment may communicate collected object data to the autonomous vehicle 101 when the autonomous vehicle 101 is in proximity to a given sensor, such as when the autonomous vehicle 101 passes a sensor (e.g., where the sensor is placed in or underneath the roadway or where the sensor is placed on the side of the roadway.) Moreover, a combination of aforementioned or similar data collection means may be used in developing the disclosed behavior models.

The autonomous vehicle 101 may track and record object data in any number of driving environments, such as an elementary school crossing, a highway interchange, a suburban intersection, a four-way stop sign intersection, or any other driving environment. After tracking nearby vehicles and/or pedestrians in one or more of these driving environments, the autonomous vehicle 101 may communicate the collected object data to an object behavior model server 142, shown in FIG. 1. While the object behavior model server 142 is shown separately from the autonomous vehicle 101, it should be understood that the object behavior model server 142 may also be incorporated into the autonomous vehicle 101, such as by being incorporated into the autonomous driving computer system 110. Moreover, portions of the object behavior model server 142 may also reside in the memory 130 of the autonomous driving computer system 110. Combinations of the foregoing are also possible.

The behavior model server 142 is operative to develop behavior models for the various classifications of objects based on the object data 116 collected by the autonomous vehicle 101. As used in this disclosure, a "behavior model" may refer to the expected behavior of a given classification of objects in a particular driving environment. For example, the object behavior model server 142 may define a behavior model for passenger vehicles entering a four-way intersection. In this example, the behavior model may define the probability that a passenger vehicle proceeds straight through the intersection, the probability that a passenger vehicle turns left at the intersection, and the probability that the passenger vehicle turns right at the intersection.

The behavior model may further define the behavior of the passenger vehicle, such as the approximate amount of time the passenger vehicle is expected to stop at the intersection, the approximate amount of time the passenger vehicle is expected to move through the intersection, the approximate speed of the passenger as it turns or proceeds through the intersection, or other such behavior information. In this manner, a behavior model may provide the autonomous vehicle 101 with behavior information such that the autonomous vehicle 101 may predict the behavior of the corresponding classification of vehicle in a given driving environment. Based on the behavior information provided by the behavior model, the autonomous vehicle 101 may respond with an action or take an action depending on the predicted behavior defined by the behavior model.

In addition to how an object itself may behave, a behavior model may provide information as to how the autonomous vehicle 101 may react or behave. For example, the behavior model may provide information that influences whether the autonomous vehicle 101 accelerates, decelerates, turns right, turns left, enables an indicator (e.g., turning on a headlight or turning light), disables an indicator (e.g., turning off a headlight or turning light), or engages some other vehicle behavior (e.g., turning on/off windshield wipers, turning on/off fog lights, turning on/off high beams, etc.) Thus, a behavior model may not only incorporate information about what the behavior of the associated object may be, but the behavior model may also provide information that may influence how the autonomous vehicle 101 vehicle may react.

In addition, behavior models for differing classifications of objects may provide information that leads to differing actions by the autonomous vehicle 101 depending on the type of object associated with the behavior model. For example, a behavior model associated with a passenger vehicle classification may provide information that influences the autonomous vehicle 101 to take actions that are different for a behavior model associated with a motorcycle classification. Moreover, the actions may differ even when the predicted action of the object is the same. For example, a motorcycle behavior model and a passenger vehicle behavior model may define that the associated objects (i.e., the motorcycle and the passenger vehicle) may turn left under a given circumstance, but that the behavior of the autonomous vehicle 101 may be different for each circumstance. Thus, a behavior model may be further defined by the type of object classification (e.g., motorcycle, passenger vehicle, commercial truck, etc.) assigned to the behavior model.

A behavior model may also generalize, or be specific to, a given driving environment. For example, a behavior model may define the behavior of a given object classification for a four-way intersection. However, the behavior model may be more specific in that the behavior model may correspond to a particular geographic location having a four-way intersection (e.g., the intersection of 5th Avenue and 42nd Street in New York City, New York). Thus, depending on the granularity and specificity of the behavior model, the behavior model may provide behavior information regarding an object classification for a given type of driving environment, or may even provide behavior information regarding an object classification for a specific geographic location of a given type of driving environment.

Moreover, a behavior model may be tailored or based on specific types of driving conditions. For example, a behavior model may provide behavior information based on weather conditions (e.g., rain, snow, sleet, hail, fog, etc.) A behavior model based on a first weather condition (e.g., rain) may provide information that differs from a behavior model based on a second weather condition (e.g., snow). The differing information may be associated with the corresponding object classification of the behavior model, the behavior of the autonomous vehicle 101, or a combination thereof. Other examples of driving conditions on which a behavior model may be based include the time of day, traffic conditions, whether there a blind corner is involved in a road/intersection, whether a hill is involved in a roadway, or other such driving conditions.

The object behavior model server 142 is operative to develop behavior models that do not yet exist for corresponding object classifications and to refine already existing behavior models. With regard to developing new behavior models, the object behavior model server 142 may initially receive object data 116 (e.g., behavior and/or state data) from the autonomous vehicle 101. The object behavior model server 142 may then determine whether a behavior model already exists for the object classification corresponding to the received object data 116. Should the object behavior model server 142 not have an existing behavior model, the object behavior model server 142 may then develop a new behavior model for the corresponding object classification. However, should a behavior model already exist for the corresponding object classification, the object behavior model server 142 may then refine the behavior model by supplementing the behavior information in the already-existing behavior model with the newly-received object data from the autonomous vehicle 101. In this manner, the behavior models residing on the object behavior model server 142 may be continuously refined to improve the accuracy of the developed behavior models and the behavior prediction of the autonomous vehicle 101.

Figure 7:
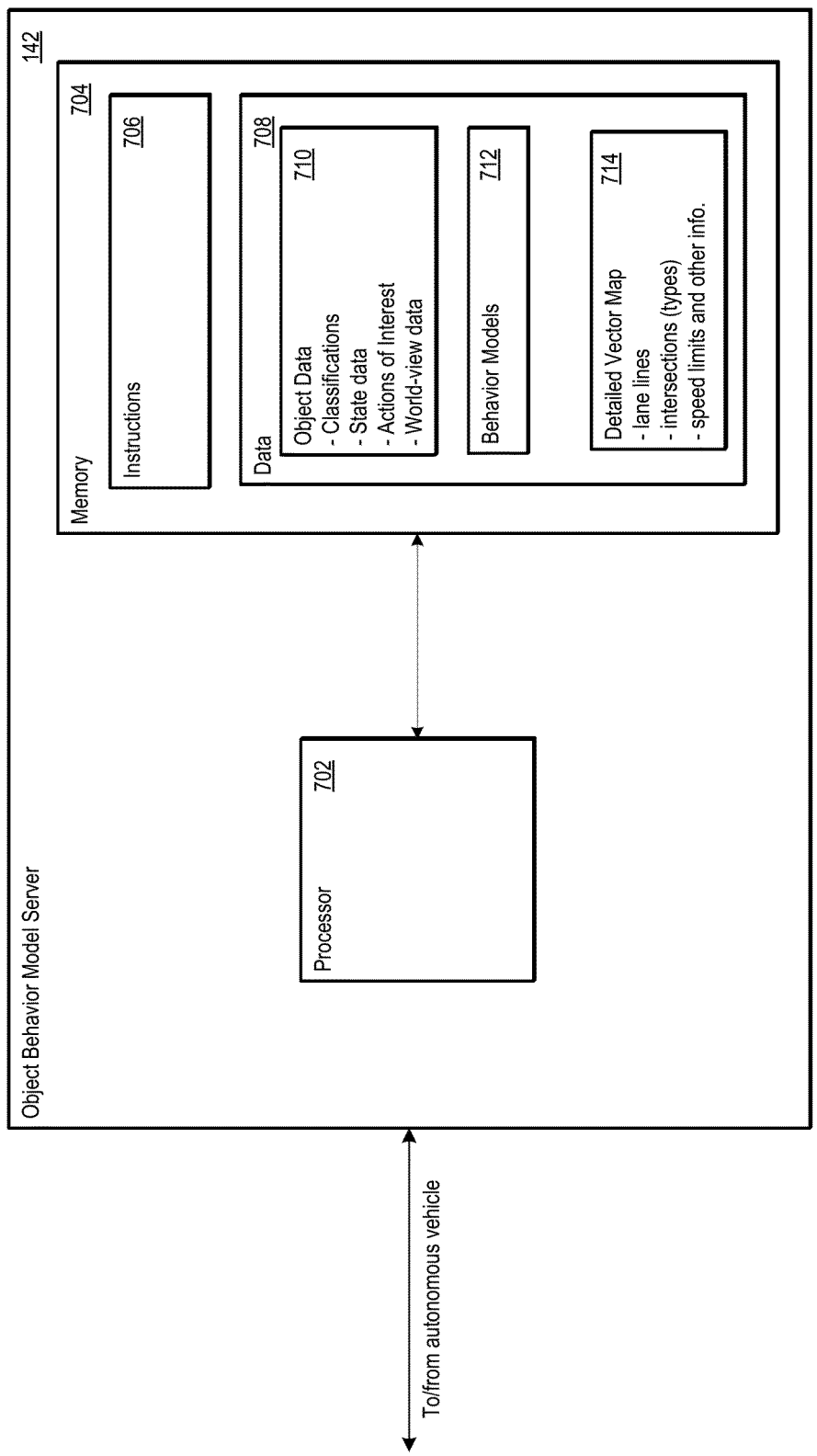
FIG. 7 is a functional diagram of a behavior model server in accordance with an aspect of the disclosure.

FIG. 7 illustrates one example of the object behavior model server 142. In one embodiment, the object behavior model server 142 may include a processor 702 and a memory 704. The object behavior model server 142 may also include other components typically present in a general purpose computer. The memory 704 may store information accessible by the processor 702, such as instructions 706 and data 708 that may be executed or otherwise used by the processor 702. The memory 704 may be of any type of memory operative to store information accessible by the processor 702, including a computer-readable medium, or other medium that stores data that may be read with the aid of an electronic device. Examples of the memory 704 include, but are not limited, a hard-drive, a memory card, ROM, RAM, DVD, or other optical disks, as well as other write-capable and read-only memories. Systems and methods may include different combinations of the foregoing, whereby different portions of the instructions and data are stored on different types of media.

The instructions 706 may be any set of instructions that may be executed directly (such as machine code) or indirectly (such as scripts) by the processor 702. For example, the instructions 706 may be stored as computer code on the computer-readable medium. In that regard, the terms "instructions" and "programs" may be used interchangeably herein. The instructions 706 may be stored in object code format for direct processing by the processor 702, or in any other computer language including scripts or collections of independent source code modules that are interpreted on demand or compiled in advance. Functions, methods and routines of the instructions 706 are explained in more detail below.

The data 708 may be retrieved, stored, or modified by the processor 702 in accordance with the instructions 706. For instance, although the disclosed embodiments not limited by any particular data structure, the data 708 may be stored in computer registers, in a relational database as a table having a plurality of different fields and records, XML documents, flat files, or in any computer-readable format. By further way of example only, image data may be stored as bitmaps comprised of grids of pixels that are stored in accordance with formats that are compressed or uncompressed, lossless (e.g., BMP) or lossy (e.g., JPEG), and bitmap or vector-based (e.g., SVG), as well as computer instructions for drawing graphics. The data 708 may comprise any information sufficient to identify the relevant information, such as numbers, descriptive text, proprietary codes, references to data stored in other areas of the same memory or different memories (including other network locations) or information that is used by a function to calculate the relevant data.

The processor 702 may be any conventional processor that is commercially available. Alternatively, the processor 702 may be a dedicated device such as an ASIC or FPGA. Although FIG. 7 functionally illustrates the processor 702, the memory 704, and other elements of the object behavior model server 142 as being within the same block, it will be understood by those of ordinary skill in the art that the processor 702 and the memory 704 may actually comprise multiple processors and memories that may or may not be stored within the same physical housing. For example, the memory 704 may be a hard drive or other storage media located in a housing different from that of the object behavior model server 142.

As discussed previously, the object behavior model server 142 may be operative to develop new behavior models or refine already existing behavior models based on the information collected by the autonomous vehicle 101. In one embodiment, data 708 stored in the memory 704 includes received object data 710, one or more behavior models 712, and a detailed map 714. The received object data 710 may include the object data 116 collected by the autonomous vehicle 101, including classification of the object, actions of interest that have been performed by the object, and world-view data. In addition, the object data 710 may include object data collected by other means, such as satellite imagery, traffic reports, police reports, and other such means.

The object behavior model server 142 may develop one or more of the behavior models 712 based on the object data 710. As discussed previously, each classification of object (e.g., passenger vehicle, light truck, pedestrian, bicycle, etc.) may be associated with one or more behavior models. In one embodiment, an object classification may be associated with a number of behavior models, where each behavior model corresponds to a driving environment, including the object's current world-view and potential actions of interest that have recently been performed and are currently available to the object. For example, with reference to FIG. 5, a "passenger vehicle" object classification may be associated with a behavior model for vehicle 510. The environment for vehicle 510 is the center lane of multiple-lane road 500, which would allow for various potential actions of interest, including vehicle 510 changing into the adjacent right-hand lane.

In one embodiment of the object behavior model server 142, the object behavior model 142 may develop behavior models based on the expected probability that an object will perform a given action. For example, with reference to FIG. 5, the object behavior model server 142 may receive object data about one or more vehicles 510-550, such as the number times a vehicle of the same classification as vehicle 520 turned (e.g., followed path A2) or the number of times a vehicle of the classification of vehicle 530 changed lanes (e.g., followed path B2). In this embodiment, the object behavior model server 142 may determine the expected probability that a given classification of vehicle will turn by determining number of times the path A2 and dividing this number by the total number of paths taken. Similarly, the object behavior model server 142 may determine the expected probability that a given classification of vehicle will continue straight by determining the number of times path B2 was taken and dividing this number by the total number of paths taken.

However, a more robust behavior model may alternatively be implemented by server 142. The object data provided by the autonomous vehicle includes the world-view data representing how each detected object perceives its surroundings. This data may be used to further limit or alter the probable actions of each detected object. Specifically, server 142 may use the world-view data, which provides an object-centric perspective of detected vehicle's environment, to determine how other vehicles or pedestrians might react, given their perception of other nearby objects.

For example, the autonomous vehicle 101 in FIG. 5 will provide server 142 with object data for vehicle 510 that identifies nearby objects that can be perceived by vehicle 510, including vehicles 520, 530, 540, and 550, as well as autonomous vehicle 101. The object data 710 will also include position and movement data for each of these nearby objects relative to vehicle 510. For example, server 142 may receive object data 710 indicating that vehicle 520 has turned on its left-hand blinker or is slowing down as it approaches the next intersection. Server 142 may, in turn, predict that vehicle 520 intends to make a left-hand turn, as indicated by directional arrow A2. Based on this additional data regarding vehicle 520, and by accessing the behavior model database 712, server 142 is capable of altering its prediction of vehicle 510's future movement. In particular, server 142 determines how often a passenger vehicle would change lanes if placed in vehicle 510's position behind the turning vehicle 520. Given that none of the other nearby vehicles occupy the center-lane in vehicle 510's direction of travel, the behavior model database 712 may predict that in this situation vehicle 510 has a high probability of changing into the center lane, as indicated by directional arrow B2, in order to avoid being impeded by vehicle 520.

Server 142 may perform a similar, object-centric behavior prediction for each of the other nearby vehicles in FIG. 5. For example, server 142 may determine how a passenger vehicle would react if placed in the position of vehicle 520, and determine that given the presence of vehicles 540 and 550, vehicle 520 will need to come to a complete stop before making the left-hand turn along path A2. In turn, the behavior model 712 will likely increase the probability of vehicle 510 changing lanes along path B2, as it will be directly behind a stopped vehicle. In this way, server 142 is able to determine how each nearby vehicle perceives its surroundings and to adjust the predicted behavior of each vehicle based on the predicted behavior of other nearby vehicles.

Server 142 may further alter the predicted behavior of vehicles 510 and 520 based on previous actions of interest that have occurred. For example, if vehicle 510 had very recently changed from the adjacent right-hand lane into its current lane, the behavior model might determine the probability of a vehicle 510 immediately changing back into the adjacent right-hand lane, along path B2. If this is a low probability event, the behavior model might lower the probability of vehicle 510 changing lanes. The behavior model may also rely on information that is independent of other detected object's in order to predict the an object's next action. By way of example, if the vehicle determines that another object is a bicycle that is beginning to ascend a steep hill in front of the vehicle, the computer may predict that the bicycle will soon slow down—and will slow the vehicle down accordingly—regardless of whether the bicycle is currently traveling at a somewhat high speed.

As is understood in the art, determining expected probabilities that a particular path will be followed is one statistical technique that may be used to predict the behavior of a given object or to provide information for influencing the behavior of the autonomous vehicle 101. In addition, a variety of statistical estimation techniques may be used, alone or in combination, including any existing statistical estimation, machine learning, classification or other optimization methods. Further examples include regression analysis, neural networks, decision trees, boosting, support vector machines, k-nearest neighbors, combinations of the foregoing, and other such examples.

Server 142 may use separate behavior models for different classifications of objects, including passenger vehicles, tractor-trailers, bicycles, or pedestrians. For example, a pedestrian or cyclist will not react to its surroundings in the same way as autonomous vehicle 101. In addition, an autonomously navigated station wagon often will not react the same was as a sports car that is being controlled by a driver. Accordingly, database 712 may include different object-centric behavior models for different classifications of objects, including autonomous or non-autonomous vehicles.

Figure 8:
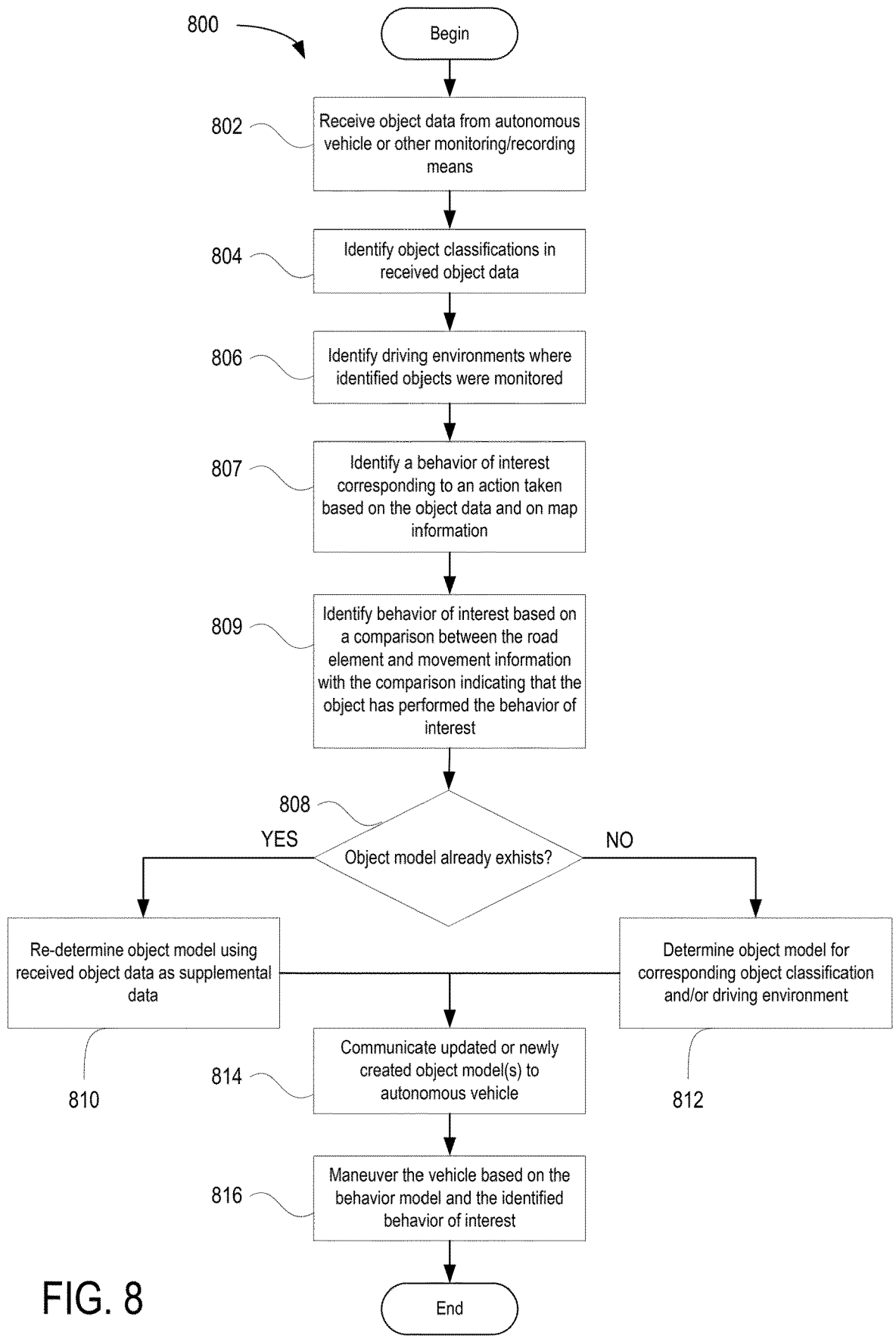
FIG. 8 is a flow chart for a behavior server in accordance with an aspect of the disclosure.

FIG. 8 illustrates one example of logic flow 800 for developing behavior models for the various object classifications. Initially, the object behavior model server 142 may receive object data-including position data, actions-of-interest data, and world-view data—from the autonomous vehicle 101 (Block 802). Thereafter, the object behavior model server 142 may analyze the received object data to determine the object classifications identified by the object data (Block 804). The object behavior model server 142 may then identify the driving environments of the identified object classifications based on the position data and the world-view data (Block 806). The object behavior model server 142 then identifies a behavior of interest corresponding to an action taken by the object based on the object data and on map information identifying a road element corresponding to the location of the object (Block 807) and identifying the behavior of interest is further based on a comparison between the road element and the movement information with the comparison indicating that the object has performed the behavior of interest (Block 809).

Using the identified object classifications and identified driving environments, the object behavior model server 142 may determine whether corresponding behavior models already exist (Block 808). Should corresponding behavior models already exist, (Yes at Block 808) the object behavior model server 142 may refine the already existing behavior models using the received object data as supplemental data. Refining an already existing behavior model may include re-determining the behavior model for a given classification and/or driving environment using the already existing behavior model and the received object data as supplemental data (Block 810). In other words, the already existing behavior model may be updated with the object's world-view, classification, and actions of interest data. However, should a behavior model not exist for the corresponding object classification and/or driving environment (No at Block 808), the object behavior model server 142 may then develop a corresponding behavior model using the received object data (Block 812). The object behavior model server 142 may then communicate the updated or newly created behavior model to the autonomous vehicle 101 for use in predicting the behavior of detected objects (Block 814). The object behavior model server 142 may then maneuvering the vehicle based on the behavior model and the identified behavior of interest (Block 816).

In this manner, the monitoring and recording of detected object behavior by the autonomous vehicle 101 may facilitate the development of robust behavior models for predicting the behavior of the monitored and recorded objects based on how the object perceives its surroundings, as well as based on the previous actions of interest that it has performed. Moreover, the behavior models may be tailored to specific driving environments along various parameters. Because the behavior models may be customized with parameters specific to a given driving environment, the autonomous vehicle 101 may better accurately predict the behavior of a detected object and take actions (e.g., braking, accelerating, etc.) in response to the behavior of the detected object. In addition, since the autonomous vehicle 101 may continuously collect behavior information about detected objects, already existing behavior models may be further refined to better reflect the behavior of real-world objects. Thus, the partnership between the behavior model behavior server 142 and the autonomous vehicle 101 forms a symbiotic relationship in which the monitoring by the autonomous vehicle 101 enhances the behavior models determined by the object behavior model server 142, and the updated behavior models determined by the object behavior model server 142 improve the performance and reaction time of the autonomous vehicle 142.

Figure 9:
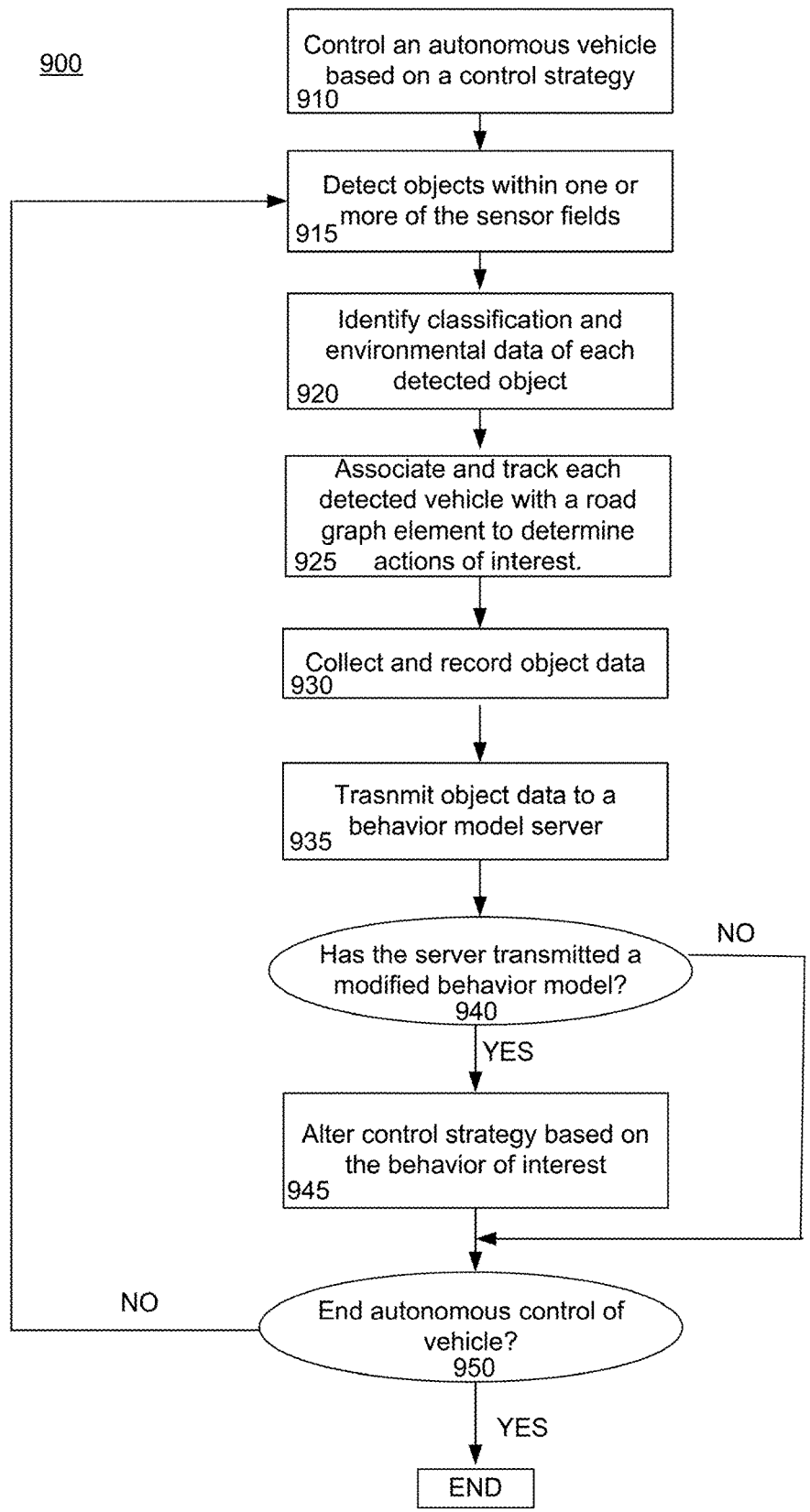
FIG. 9 is a flow chart for an autonomous vehicle in accordance with an aspect of the disclosure.

Autonomous vehicle 101 may transport itself, passengers, and/or cargo between two locations by following a route. For example, a driver may input a destination and activate an autonomous mode of the vehicle. In response, the vehicle's computer 110 may calculate a route using a map, its current location, and the destination. Based on the route (or as part of the route generation), the vehicle may determine a control strategy for controlling the vehicle along the route to the destination. For example, the control strategy may include where to turn, at what speeds to travel, what lane to travel in, where to look for traffic signals, where to stop for intersections or stop signs, etc. Flow diagram 900 of FIG. 9 provides an example by which vehicle 101 may be autonomously controlled in response to the model behavior data. As provided in Block 910, vehicle 101 implements the determined control strategy by traveling along a determined route. This control strategy may be based on a behavior model that is currently residing in the memory of autonomous vehicle 101. While traveling in accordance with the control strategy, vehicle 101 detects the presence of numerous objects within one or more of the vehicle's sensor fields (Block 915). Upon detecting the objects, the computer 110 may classify the object based on the data received by vehicle 101's sensors and determine environmental information, such as its position and movement relative to other objects (Block 920). For example, the sensor data could be used to classify objects as being a pedestrian, bicycle, or vehicle. As described above, the vehicle's computer 110 also uses the sensor data to determine the object's current state, such as speed, heading, and acceleration. Upon determining the objects classification and current state, the computer 110 may associate and track the detected objects with a road graph element by accessing a map in database 114 (FIG. 1), and determining whether the detected objects have performed a behavior of interest by comparing the object's position and movement with the map's road graph element (Block 925). Autonomous vehicle 101 records object data for each of the detected objects, including actions of interest and world-view data relating to how the objects perceive their surroundings (Block 930).

Autonomous vehicle may then transmit the recorded object data to a remote behavior model server (Block 935). Autonomous vehicle may then determine whether the server has provided a modified behavior model (Block 740). If the server has provided a modified behavior model, computer 110 may then alter the control strategy of autonomous vehicle 101 (Block 745). If not, Blocks 715 through 745 may then be repeated until autonomous vehicle 101 has reached its destination or the autonomous control has be otherwise terminated (Block 750). In this way, vehicle 101 may further alter the control strategy upon any of the detected vehicles performing an action of interest.

As shown in FIG. 2, Vehicle 101 may include one or more user input devices that enable a user to provide information to the autonomous driving computer 110. For example, a user, such as passenger 290, may input a destination (e.g., 123 Oak Street) into the navigation system using touch screen 217 or button inputs 219. In another example, a user may input a destination by identifying the destination. In that regard, the computer system may extract the destination from a user's spoken command (e.g., by stating or inputting "De young museum").

The vehicle may also have various user input devices for activating or deactivating one or more autonomous driving modes. In some examples, the driver may take control of the vehicle from the computer system by turning the steering wheel, pressing the acceleration or deceleration pedals. The vehicle may further include a large emergency button that discontinues all or nearly all of the computer's decision-making control relating to the car's velocity or direction. In another example, the vehicle's shift knob may be used to activate, adjust, or deactivate these autonomous modes.

In one aspect, the features described above may be used in combination with larger vehicles such as trucks, tractor trailers, or passenger busses. For such vehicles, the system may consider additional information when computing how to control the vehicle safely. For example, the physical attributes of a tractor trailer, such as its articulation and changing weight, may cause it to maneuver very differently than smaller passenger cars. Larger vehicles may require wider turns or different levels of acceleration and braking in order to avoid collisions and maneuver safely. The computer may consider the geometry of the vehicle when calculating and executing maneuvers such as lane changes or evasive actions.

The vehicle may be only partially autonomous. For example, the driver may select to control one or more of the following: steering, acceleration, braking, and emergency braking.

The vehicle may also address driver impairment. For example, if a driver has been unresponsive, has reduced cognitive abilities, or has been detected as having fallen asleep, the vehicle may attempt to wake or otherwise prompt the driver to respond. By way of example only, a camera capturing the driver's face may be used to determine whether the driver's eyes have remained closed for an extended period of time. If the driver remains unresponsive, the computer may cause the vehicle slow, stop or pull over to a safe location, or may assume control over the vehicle's direction or speed to avoid a collision.

In another example, the system may be always on with the driver primarily in control of the vehicle, but only intervene and take action when the vehicle detects that there is an emergency situation. For example, if a thick fog reduces the visibility of the driver, the vehicle may use its sensors to detect the presence of objects in the vehicle's path. If the vehicle determines that a collision is imminent yet the driver has taken no action to avoid the collision, the vehicle may provide the driver with a warning and, absent further correction by the driver, take one or more evasive actions such as slowing, stopping or turning the vehicle.

The vehicle may also improve driver performance while the vehicle is under the control of a driver. For example, if a driver fails to maintain the vehicle's position within a lane without using a turn signal, the vehicle may slightly adjust the steering in order to smooth out the vehicle's movements and maintain the vehicle's position within the lane. Thus, the vehicle may mitigate the likelihood of undesirable swerving and erratic driving. In another embodiment, if a driver is on a course to change lanes but has not activated the turn signal, the vehicle may automatically activate the turn signal based on the detected course of the vehicle.

The vehicle may also be used to train and test drivers. For example, the vehicle may be used to instruct new drivers in the real world, but may control various aspects of the ride in order to protect the new driver, people external to the car, and external objects. In another example, new drivers may be required to control the vehicle safely for some period. The vehicle may then determine whether the user is a safe driver and thus determine whether the user is ready to be a licensed driver.

The vehicle may also park itself. For example, the map information may include data describing the location of parking spots along a roadway or in a parking lot. The computer may also be configured to use its sensors to determine potential parking spots, such as causing the vehicle to travel down a road and checking for painted lines along a street that indicate an open parking space. If computer determines another vehicle or object is not within the spot, the computer may maneuver the vehicle into the parking spot by controlling the steering and speed of the vehicle. Using the method described above, the vehicle may also classify any objects that are near the potential parking spot, and position the vehicle within the parking spot based on those surrounding objects. For example, the vehicle may position itself closer to an adjacent bicycle than it would an adjacent truck.

The vehicle may also have one or more user interfaces that allow the driver to reflect the driver's driving a style. For example, the vehicle may include a dial which controls the level of risk or aggressiveness with which a driver would like the computer to use when controlling the vehicle. For example, a more aggressive driver may want to change lanes more often to pass cars, drive in the left lane on a highway, maneuver the vehicle closer to the surrounding vehicles, and drive faster than less aggressive drivers. A less aggressive driver may prefer for the vehicle to take more conservative actions, such as somewhat at or below the speed limit, avoiding congested highways, or avoiding populated areas in order to increase the level of safety. By manipulating the dial, the thresholds used by the computer to calculate whether to pass another car, drive closer to other vehicles, increase speed and the like may change. In other words, changing the dial may affect a number of different settings used by the computer during its decision making processes. A driver may also be permitted, via the user interface 225, to change individual settings that relate to the driver's preferences. In one embodiment, insurance rates for the driver or vehicle may be based on the style of the driving selected by the driver.

Aggressiveness settings may also be modified to reflect the type of vehicle and its passengers and cargo. For example, if an autonomous truck is transporting dangerous cargo (e.g., chemicals or flammable liquids), its aggressiveness settings may be less aggressive than a car carrying a single driver-even if the aggressive dials of both such a truck and car are set to "high." Moreover, trucks traveling across long distances over narrow, unpaved, rugged or icy terrain or vehicles may be placed in a more conservative mode in order reduce the likelihood of a collision or other incident.

In another example, the vehicle may include sport and non-sport modes which the user may select or deselect in order to change the aggressiveness of the ride. By way of example, while in "sport mode", the vehicle may navigate through turns at the maximum speed that is safe, whereas in "non-sport mode", the vehicle may navigate through turns at the maximum speed which results in g-forces that are relatively imperceptible by the passengers in the car.

The vehicle's characteristics may also be adjusted based on whether the driver or the computer is in control of the vehicle. For example, when a person is driving manually the suspension may be made fairly stiff so that the person may "feel" the road and thus drive more responsively or comfortably, while, when the computer is driving, the suspension may be made such softer so as to save energy and make for a more comfortable ride for passengers.

The vehicle may include a sleeping mode that allows the driver to give full control of the vehicle to the computer so that the driver may sleep or reduce his or her focus on the roadway. For example, the vehicle may include a user input device that allows the user to input information such as the duration of the sleep mode, e.g., 20 minutes, 4 hours, 8 hours, etc. In response, the vehicle may drive slower or on less traveled roadways, select a route that will get the driver to the destination in the identified period, or select a route which that avoid bumps or other disturbances to the driver.

The driver may also select to have his or her vehicle communicate with other devices. As shown in FIG. 10, vehicle 101 may communicate over a network 960 with devices such as a remote server 142, a personal computer 965, a mobile device 970, or another autonomous vehicle 102. In addition, vehicles, such as vehicle 101 and vehicle 102, may wirelessly transmit information directly to nearby vehicles using radio, cellular, optical or other wireless signals. Alternatively, vehicles may communicate with each via nodes that are shared among multiple vehicles, e.g., by using cell towers to call other cars or transmit and send information to other cars via the Internet. The transmitted information between vehicles may include, for example, data describing the vehicle or the vehicle's environment. In addition to receiving updated behavior model data from server 142, vehicle 101 may also receive updated map or object data via network 960. Computer system 110, of FIG. 1, may then be updated, and the new data may be used in controlling the vehicle autonomously, such as through implementation of flow diagram 900.

In one example, a driver of a first vehicle may select an option to allow other vehicles on the roadway to transmit information from the vehicle's sensors or computer. This information may include details about the first vehicle's environment such as detected objects, traffic conditions, or construction. The information transmitted to other vehicles may be sensor data unprocessed by the first computer or information previously processed by the first computer in order to reduce the time needed to obtain and process the information at a second vehicle. If the second autonomous vehicle is behind the first vehicle, it may use the information to determine how to maneuver the vehicle. By way of example, if the first vehicle is only a few car lengths in front of the second vehicle and it detects a moving object, the first vehicle may transmit information relating to the moving object to the second vehicle. If the second vehicle determines that the object is moving towards the second vehicle's path, the second vehicle may slow down. Yet further, if the second vehicle is a few miles behind the first vehicle and the first vehicle determines that it is in a traffic jam (e.g., by determining that its speed is substantially less than the road's speed limit), the second vehicle may select an alternate route.

In addition to cooperatively driving together in lines, autonomous vehicles may also communicate in order to increase convenience and safety on the roadways. For example, autonomous vehicles may be able to double (two vehicles in a row) and triple park (three vehicles in a row) next to other autonomous vehicles. When a driver would like to use a vehicle which is parked in or surrounded by other autonomous vehicles, the driver's vehicle may send a signal instruction the other vehicles to move out of the way. The vehicles may respond by cooperatively maneuvering to another location in order to allow the driver's vehicle to exit and may return to park again.

In another example, the cooperation mode may be used to promote smarter road crossings. For example, if several autonomous vehicles are approaching and intersection, the right-of-way problem, or which vehicle should be next to enter the intersection, may be calculated and determined cooperatively among the several vehicles. In another example, traffic signals may change quickly, such as within only a few seconds or less, to allow more vehicles to pass through an intersection in multiple directions. The vehicle may only need the traffic signal to be green for a second or less in order to pass through the intersection at high speeds.

As these number and usage of these autonomous vehicles increases, various sensors and features may be incorporated into the environment to increase the perception of the vehicle. For example, low-cost beacon transmitters may be placed on road signs, traffic signals, roads or other highway infrastructure components in order to improve the computer's ability to recognize these objects, their meaning, and state. Similarly, these features may also be used to provide additional information to the vehicle and driver such as, whether the driver is approaching a school or construction zone. In another example, magnets, RFID tags or other such items may be placed in the roadway to delineate the location of lanes, to identify the ground speed vehicle, or increase the accuracy of the computer's location determination of the vehicle.

Autonomous vehicles may also be controlled remotely. For example, if the driver is asleep, the sensor data may be sent to a third party so that vehicle may continue to have a responsive operator. While delay and latency may make this type of telemetry driving difficult, it may for example be used in emergency situations or where the vehicle has gotten itself stuck. The vehicle may send data and images to a central office and allow a third party to remotely drive the vehicle for a short period until the emergency has passed or the vehicle is no longer stuck.

As these and other variations and combinations of the features discussed above can be utilized without departing from any method, system, or apparatus set forth in the claims, the foregoing description of exemplary embodiments should be taken by way of illustration rather than by way of limitation of the claims. It will also be understood that the provision of examples (as well as clauses phrased as "such as," "e.g.", "including" and the like) should not be interpreted as limiting the scope of the claims to the specific examples; rather, the examples are intended to illustrate only some of many possible aspects.

The invention claimed is:

1. A method of maneuvering a vehicle, the method comprising:
   receiving, by one or more processors, object data identifying an object in an environment of the vehicle;
   identifying, by the one or more processors, a behavior of interest corresponding to an action taken by the object based on the object data;
   determining, by the one or more processors, a plurality of probabilities for potential actions of the object using a behavior model, the behavior model configured to predict how another object having a same classification as the object will behave;
   updating, by the one or more processors, the behavior model by adjusting the plurality of probabilities based on the behavior of interest; and
   maneuvering, by the one or more processors, the vehicle based on the updated behavior model and the behavior of interest.

2. The method of claim 1, wherein the behavior model includes paths of travel for one or more previously monitored objects.

3. The method of claim 1, wherein maneuvering the vehicle includes avoiding a trajectory for at least one of the potential actions.

4. The method of claim 1, wherein identifying the behavior of interest is further based on map information identifying a road element corresponding to a location of the object.

5. The method of claim 4, wherein the road element comprises a first lane of traffic, and wherein the action taken indicates that the object has changed from a second lane of traffic to the first lane of traffic.

6. The method of claim 1, wherein a classification of the object corresponds to a road vehicle.

7. The method of claim 1, wherein a classification of the object corresponds to a pedestrian.

8. The method of claim 1, further comprising creating, by the one or more processors, an initial behavior model for the object based on the object data, when a behavior model does not exist for a classification for the object.

9. The method of claim 1, wherein the behavior model provides information based on weather conditions.

10. A system for maneuvering a vehicle, the system comprising one or more processors configured to:
    receive object data identifying an object in an environment of the vehicle;
    identify a behavior of interest corresponding to an action taken by the object based on the object data;
    determine a plurality of probabilities for potential actions of the object using a behavior model, the behavior model configured to predict how another object having a same classification as the object will behave;
    update the behavior model by adjusting the plurality of probabilities based on the behavior of interest; and
    maneuver the vehicle based on the updated behavior model and the behavior of interest.

11. The system of claim 10, wherein the behavior model includes paths of travel for one or more previously monitored objects.

12. The system of claim 10, wherein maneuvering the vehicle includes avoiding a trajectory for at least one of the potential actions.

13. The system of claim 10, wherein the one or more processors are configured to identify the behavior of interest further based on map information identifying a road element corresponding to a location of the object.

14. The system of claim 13, wherein the road element comprises a first lane of traffic, and wherein the action taken indicates that the object has changed from a second lane of traffic to the first lane of traffic.

15. The system of claim 10, wherein a classification of the object corresponds to a road vehicle.

16. The system of claim 10, wherein a classification of the object corresponds to a pedestrian.

17. The system of claim 10, wherein the one or more processors are further configured to create an initial behavior model for the object based on the object data, when a behavior model does not exist for a classification for the object.

18. The system of claim 10, wherein the behavior model provides information based on weather conditions.

19. A non-transitory, computer readable recording medium on which instructions are stored, the instructions, when executed by one or more processors, cause the one or more processors to perform a method of maneuvering a vehicle, the method comprising:
- receiving object data identifying an object in an environment of the vehicle;
- identifying a behavior of interest corresponding to an action taken by the object based on the object data;
- determining a plurality of probabilities for potential actions of the object using a behavior model, the behavior model configured to predict how another object having a same classification as the object will behave;
- updating the behavior model by adjusting the plurality of probabilities based on the behavior of interest; and
- maneuvering the vehicle based on the updated behavior model and the behavior of interest.

20. The non-transitory, computer readable recording medium of claim 19, wherein the method further comprises creating an initial behavior model for the object based on the object data, when a behavior model does not exist for a classification for the object.

* * * * *